(12) United States Patent
Blanco et al.

(10) Patent No.: US 11,476,155 B2
(45) Date of Patent: Oct. 18, 2022

(54) PATTERNING METHOD

(71) Applicant: IMEC VZW, Leuven (BE)

(72) Inventors: Victor M. Blanco, Leefdaal (BE);
Frederic Lazzarino, Hamme-Mille (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/237,699

(22) Filed: Apr. 22, 2021

(65) Prior Publication Data

US 2021/0335664 A1    Oct. 28, 2021

(30) Foreign Application Priority Data

Apr. 23, 2020   (EP) ..................................... 20171065

(51) Int. Cl.
*H01L 21/768*   (2006.01)
*H01L 21/033*   (2006.01)

(52) U.S. Cl.
CPC .... *H01L 21/76813* (2013.01); *H01L 21/0337* (2013.01); *H01L 21/76811* (2013.01); *H01L 21/76816* (2013.01)

(58) Field of Classification Search
CPC ........................ H01L 21/0337; H01L 21/76811
See application file for complete search history.

(56) References Cited

U.S. PATENT DOCUMENTS

| | | | |
|---|---|---|---|
| 9,812,351 B1* | 11/2017 | Licausi | H01L 21/76816 |
| 9,818,641 B1 | 11/2017 | Bouche et al. | |
| 10,043,703 B2* | 8/2018 | Bouche | H01L 21/302 |
| 10,147,637 B2* | 12/2018 | Drissi | H01L 21/76843 |
| 11,239,077 B2* | 2/2022 | Liu | H01L 21/76897 |

FOREIGN PATENT DOCUMENTS

EP   3618103 A1   3/2020

OTHER PUBLICATIONS

Extended European Search Report and Written Opinion, European Application No. 20171065.4, dated Oct. 7, 2020, 8 pages.

* cited by examiner

*Primary Examiner* — Daniel Luke
(74) *Attorney, Agent, or Firm* — McDonnell Boehnen Hulbert & Berghoff LLP

(57) ABSTRACT

A method that provides patterning of an underlying layer to form a first set of trenches and a second set of trenches in the underlying layer is based on a combination of two litho-etch (LE) patterning processes supplemented with a spacer-assisted (SA) technique. The method uses one or more first upper blocks formed by a tone-inversion approach, an upper memorization layer allowing first memorizing upper trenches, and then second upper blocks, and a lower memorization layer allowing first memorizing first lower trenches and one or more first lower blocks, and then second lower trenches and one or more second lower blocks.

20 Claims, 25 Drawing Sheets

PATTERNING METHOD

CROSS-REFERENCE TO RELATED APPLICATIONS

The present application is a non-provisional patent application claiming priority to European Patent Application No. 20171065.4, filed Apr. 23, 2020, the contents of which are hereby incorporated by reference.

FIELD OF THE DISCLOSURE

This application relates to a patterning method.

BACKGROUND

Lithography and etching processes ("litho-etch") are frequently used in semiconductor device fabrication, for instance, to form trenches, openings or other patterns in, e.g., a hard mask layer, a dielectric layer, a metal layer, or a semiconductor layer. A pattern such as a trench pattern may be lithographically defined (i.e., exposed and developed) in a resist layer and transferred into an underlying layer by etching. The minimum critical dimensions (CDs) of litho-etch based patterning is dependent on the wavelength of the light used for exposing resist. Hence, extreme ultraviolet lithography (EUVL) facilitates producing patterns with reduced CDs compared to current technologies based on, for instance, 193i.

In spacer-assisted multiple patterning techniques (also known as self-aligned multiple patterning techniques) such as SADP or SAQP, grating-like patterning layers of mandrel lines and spacer lines may be used to form sub-lithographic tight pitch line patterns in an underlying layer. Multiple patterning may be combined with block techniques to facilitate forming interrupted or discontinuous lines.

EP 3618103 discloses a patterning method based on a combination of two litho-etch processes supplemented with a spacer-assisted (SA) technique. The method may hence be referred to as a "SALELE" patterning process. The two LE processes allow two alternating sets of trenches to be patterned in a target layer. Employing two LE processes allows comparably tight pitch patterns to be formed by combining two relaxed pitch patterns. Meanwhile, the addition of the spacer-assisted technique makes it possible to ensure at least a minimum separation between adjacent trenches in the target layer. Forming of interrupted trenches with small tip-to-tip separation is facilitated through the use of block patterns.

Although state of the art patterning methods offers a path towards increasingly aggressive target CDs, more aggressive target CDs imply an increasing sensitivity towards process variability, notably a sensitivity to edge placement errors (EPE).

SUMMARY

In light of the above, an aspect of the application provides a patterning method that facilitates forming trench patterns that comprise interrupted trenches, with a reduced sensitivity to process variability, and in particular having an improved EPE margin. Further and alternative aspects may be understood from the following.

According to a first aspect, a patterning method comprises:

forming over an underlying layer a lower memorization layer and an auxiliary block mask layer over the lower memorization layer;

forming block openings in the auxiliary block mask layer;

forming first upper blocks in the block openings;

forming an upper memorization layer over the lower memorization layer and the first upper blocks;

patterning the upper memorization layer using lithography and etching to form upper trenches in the upper memorization layer, wherein at least a subset of the upper trenches are interrupted by a respective first upper block;

forming sidewall spacer lines along sidewalls of the upper trenches;

patterning the lower memorization layer to form first lower trenches in the lower memorization layer, the patterning comprising etching while the patterned upper memorization layer, the sidewall spacer lines, and the first upper blocks mask the lower memorization layer, wherein at least a subset of the first lower trenches are interrupted by a respective first lower block formed of a respective first lower memorization layer portion masked by a respective first upper block;

patterning the patterned upper memorization layer using lithography and etching to form second upper blocks of remaining upper memorization layer portions, and patterning the patterned lower memorization layer to form second lower trenches in the patterned lower memorization layer.

The patterning comprises:

forming an auxiliary trench mask stack over the lower memorization layer and patterning auxiliary trenches therein by lithography and etching, and etching the patterned lower memorization layer while the patterned auxiliary trench mask stack, the spacer lines and the second upper blocks mask the patterned lower memorization layer, and the first upper blocks mask the first lower blocks, wherein at least a subset of the second lower trenches are interrupted by a respective second lower block formed of a respective second lower memorization layer portion masked by a respective second upper block.

The first aspect further comprises patterning in the underlying layer a first set of trenches underneath the first lower trenches and a second set of trenches underneath the second lower trenches.

The method allows patterning of the underlying layer to form a first set of trenches and a second set of trenches in the underlying layer. The method is based on a combination of two litho-etch (LE) patterning processes supplemented with a spacer-assisted (SA) technique. Accordingly, the method may be referred to as a "SALELE" patterning process, and confers aspects corresponding to those of the aforementioned SALELE process. Among others, the method facilitates an increased flexibility for the shape of the trench patterns compared to conventional SADP and SAQP techniques. Additionally, the method facilitates forming of trench patterns with smaller CDs than provided by conventional pure lithographical patterning techniques.

Furthermore, employing LE processes for patterning the upper trenches and for patterning the second lower trenches allows comparably tight pitch patterns to be formed by combining two relaxed pitch patterns. In an example, these processes may be utilized in combination with EUVL, which otherwise is a technique prone to stochastic failures if used to directly form aggressively scaled patterns. Relaxed printing may provide corresponding aspects also in 193i applications.

The method uses a layer stack comprising two memorization layers: A lower memorization layer over (e.g., on) the underlying layer in which the first and second sets of trenches are to be formed, and an upper memorization layer over (e.g., on) the lower memorization layer. Each one of the lower and upper memorization layers is provided for memorizing a (respective) pattern. As the method proceeds, each memorization layer is used more than once to facilitate the trench formation in the underlying layer. The upper memorization layer allows first memorizing upper trenches, and then upper blocks. Since the upper blocks are formed by patterning the already patterned upper memorization layer, the upper blocks may be self-aligned with respect to the first set of lower trenches and consequently reliably be aligned with the second set of lower trenches. The lower memorization layer allows first memorizing first lower trenches and one or more first lower blocks, and then second lower trenches and one or more second lower blocks.

The use of blocks (e.g., the first and second upper blocks) to define trench interruptions facilitates forming of interrupted trenches with smaller tip-to-tip separation than would be achievable by directly "printing" lithography-defined interrupted trenches into the memorization layers.

According to the method, the first upper blocks may be formed in a tone-inversion approach, i.e., by filling openings rather than a "positive" printing of blocks in a layer (i.e., a "non-tone-inverted" approach). This facilitates definition of even smaller tip-to-tip separations. This further facilitates use of trimming techniques to achieve even smaller tip-to-tip separations, as will be set out below.

Moreover, the method confers the above-discussed aspects in conjunction with allowing a reduced sensitivity to process variability, in particular an improved margin against EPE during the patterning of the second lower trenches.

The improved margin is facilitated, at least in part, by the formation of the first upper blocks over the lower memorization layer and memorizing the first upper blocks also as first lower blocks underneath the first blocks. These "two-tone" comprising blocks (i.e., the first lower blocks underneath the first blocks representing two different tones) provide masking of the first lower blocks by the first upper blocks during the patterning of second lower trenches (in the already patterned lower memorization layer). Hence, even if an auxiliary trench in the auxiliary trench mask stack extends above/overlaps a first upper block and a first lower block along a first lower trench, the first upper block may counteract etching of the first lower block. Hence, trench interruptions of the first lower trenches, memorized as the first lower blocks, may also be preserved following the second lower trench formation.

Moreover, according to the method, the sidewall spacer lines are present during the patterning of both the first and second lower trenches.

The presence of the sidewall spacer lines makes it possible to ensure at least minimum separation between the first lower trenches and the second lower trenches. Hence, if an auxiliary trench in the auxiliary trench mask stack (by design or due to an EPE) extends above/overlaps a first lower trench, the spacer line portion extending along the exposed first lower trench may mask (and hence counteract etching of) a lower memorization layer portion underneath the spacer line portion. Thus, a second lower trench may be etched in the lower memorization layer, through the overlapping auxiliary trench, while the spacer line portion ensures that the first lower trench and the second lower trench are separated by the masked lower memorization layer portion, e.g., having a width determined by a linewidth of the spacer line.

As may be appreciated from the above discussion of the first aspect, the lower and upper memorization layers represent different layers, each formed of a respective material. A material of the lower memorization layer ("lower layer material") and a material of the upper memorization layer ("upper layer material") may thus be different. For example, the lower layer material may be a dielectric material such as an oxide or a nitride or a carbide. The upper layer material may be amorphous silicon (aSi).

The first upper blocks may be formed of a material (block material) that is different from each one of the lower and upper layer materials. The block material may be a metal-comprising material such as a metal nitride, a metal carbide, or a metal oxide.

The underlying layer below the lower memorization layer represents a layer different from the lower and upper memorization layers. The underlying layer may be formed of a material ("underlying layer material") that is different from at least the lower layer material. As will be further described below, the underlying layer may also be a memorization layer (i.e., a "target memorization layer"). The underlying/target layer material may, for example, be formed of any of the materials discussed in connection with the block material.

The sidewall spacer lines may be formed of a material ("spacer material") that is different from each one of the upper layer material, the lower layer material and the block material, and also different from the underlying layer material. The sidewall spacer lines (for brevity "spacer lines") may be formed of typical spacer materials, such as an atomic layer deposition (ALD) deposited oxide or nitride (different from the lower and upper layer materials and the block material).

The different memorization layers (of the respective materials) allows providing an etch contrast during the various layer-patterning steps of the first method aspect. In other words, during patterning of a first layer of a first material (such as the lower memorization layer) to form trenches therein, the first layer may be etched at a greater rate than a second layer or feature of a second material also exposed to the etching process during the patterning. Thereby, the first material (of the first layer) may be selectively etched or removed, i.e., removed at a greater rate than the second material (of the second layer or feature).

A first feature masking a second feature during etching implies that the first feature is located above the second feature (or conversely, the second feature is located underneath the first feature) such that the first feature may act as an etch mask and accordingly counteract etching of the second feature.

That a first feature masks a second feature implies that the second feature is masked by at least the first feature, and possibly also other features, intermediate the first and second features, or above the first features. In other words, the first feature may act as an etch mask for the second feature, possibly together with other intermediate or above features.

Accordingly, the patterning of the lower memorization layer may comprise etching the lower memorization layer while the patterned upper memorization layer, the sidewall spacer lines and the first upper blocks act as an etch mask. The lower memorization layer may be etched at a greater rate than the patterned upper memorization layer, the sidewall spacer lines, and the first upper blocks.

The patterning of the patterned lower memorization layer may comprise etching the patterned lower memorization layer while the patterned auxiliary trench mask stack, the second upper blocks, and the spacer lines act as an etch mask. As discussed above, also the first upper blocks may act as an etch mask for the first lower blocks during the patterning of the patterned lower memorization layer. The patterned lower memorization layer may be etched at a greater rate than the patterned auxiliary trench mask stack (e.g., a mask material thereof), the second upper blocks, the spacer lines, and the first upper blocks.

The upper memorization layer may be formed over the first upper blocks and the patterned auxiliary block mask layer. The patterned auxiliary mask layer may hence be present as an intermediate layer between the upper memorization layer and the lower memorization layer during subsequent patterning steps. The upper trenches may accordingly be formed to extend through the upper memorization layer and the intermediate layer. Moreover, the upper blocks may be formed of remaining upper memorization layer portions and remaining intermediate layer portions (i.e., remaining portions of the patterned auxiliary block mask layer) underneath the upper memorization layer portions. Keeping the patterned auxiliary mask layer may amount to a simplification of the process by reducing a number of process steps preceding the forming of the upper memorization layer. Additionally, the intermediate layer may increase an available mask budget during subsequent patterning steps. If the auxiliary mask layer is formed of a same material as the upper memorization layer, the auxiliary mask layer and the upper memorization layer may together form an upper memorization layer of increased thickness. Accordingly, the above-mentioned aspects may be achieved without an increased complexity of the layer stack.

Alternatively, the patterned auxiliary block mask layer may be removed prior to forming the upper memorization layer. The upper memorization layer may hence be formed on/over the first upper blocks and on the lower memorization layer. This allows a height of the layer stack to be reduced, thus facilitating the patterning steps by reducing an aspect ratio of the trenches to be formed in the layer stack.

The first and second set of trenches may be patterned simultaneously in the underlying layer. The first and second set of trenches may alternatively be patterned sequentially. That is, the first set of trenches may be patterned in the underlying layer prior to the second set of trenches. A simultaneous approach may allow reducing the number of times a layer below the underlying layer (such as an insulating layer) is exposed to etchants.

The spacer lines may be formed using a sidewall spacer formation process comprising etching back a conformally deposited spacer layer. For example, a spacer layer may be conformally deposited (e.g., by ALD) to cover the patterned upper memorization layer, the sidewalls and bottom surfaces of the upper trenches. The spacer layer may subsequently be subjected to an anisotropic etch (e.g., a vertically biased dry etch) in a top-down direction adapted to remove spacer layer portions from horizontally oriented surfaces comprising upper surfaces of the patterned upper memorization layer, and bottom surfaces of the upper trenches, such that spacer layer portions remain on the upper trench sidewalls to form the spacer lines. A sidewall spacer formation process allows spacer lines to be reliably formed with a uniform linewidth/thickness, thereby contributing to reduced process variability.

Forming the first upper blocks may comprise depositing a block material over the auxiliary block mask layer and in the block openings, and removing block material deposited outside the block openings such that block material remains in the block openings to form the first blocks.

Forming the first upper blocks may comprise:

forming a conformal block layer of a block material over the auxiliary block mask layer and conforming to sidewalls of the block openings, wherein the block material deposited on the sidewalls merges in the block openings, and etching back the conformal block layer such that block material deposited outside the block openings is removed and block material remains in the block openings to form the first upper blocks.

Conformal layer deposition (e.g., by atomic layer deposition, ALD) allows small CD block openings to be reliably filled. The CD of a block opening may hereby be understood as a length dimension of the block opening. That is, the dimension of the block opening along the longitudinal direction of the upper trenches, or equivalently of the first lower trenches (both of which are to be formed).

By the block material deposited on the sidewalls merging, the block openings may be "closed." This allows the first upper blocks without any voids to be defined in the block openings. For a reliable merging of the block material in the block openings, the conformal block layer may be formed with a thickness of at least half the CD of the trench opening.

The etch back of the conformal block layer may comprise subjecting the conformal block layer to an anisotropic etch in a top-down direction.

Forming the block openings may comprise first patterning initial block openings in the auxiliary block mask layer using lithography and etching and subsequently forming the final block openings by forming a liner layer conforming to sidewalls of the initial block openings.

Final block openings may hence be formed with a smaller CD by "trimming" or "shrinking" the initial block openings.

The liner layer may be formed as a conformal liner layer. The (conformal) liner layer may be subjected to an etch back (e.g., subjecting a conformally deposited liner layer to an anisotropic etch in a top-down direction) to remove liner layer portions from horizontally oriented surfaces such that liner layer portions on the (vertically oriented) sidewalls of the initial block openings remain.

The method may further comprise, subsequent to forming the first lower trenches, forming an auxiliary block mask stack comprising mask material filling the upper trenches and the first lower trenches, and further comprising a resist layer.

The patterning of the patterned upper memorization layer may comprise first patterning the auxiliary block mask stack to form auxiliary blocks using lithography and etching, and then patterning the patterned upper memorization layer to form the second upper blocks, the patterning comprising etching while the auxiliary blocks mask the patterned upper memorization layer.

The patterned upper memorization layer may accordingly be masked by the auxiliary blocks during the etching. Upper blocks may thereby be formed by upper memorization layer portions masked by the auxiliary blocks. The mask material of the auxiliary block mask stack may fill the upper and lower trenches and thus cover the first lower and first upper blocks. The mask material may be a single deposited mask material layer or a stack of two or more deposited mask material layers. The mask material may be different from the upper layer material, the spacer material and the block material. The mask material may be deposited to form a planarizing mask material layer filling the trenches and covering the patterned upper memorization layer. The mask material may comprise an organic spin-on material, such as SOC.

The auxiliary trench mask stack may be formed over the lower memorization layer and the second upper blocks.

The method may comprise removing the auxiliary trench mask stack prior to patterning the first and second set of trenches in the underlying layer.

The auxiliary trench mask stack may comprise mask material forming a planarizing layer covering the second upper blocks, the spacer lines and the patterned lower memorization layer. The auxiliary trench mask stack may further comprise a resist layer over the mask material. The mask material may be a single deposited mask material layer or a stack of two or more deposited mask material layers. The mask material may be different from at least the spacer material, the lower layer material, the block material and the upper layer material. The mask material may be an organic spin-on material, such as SOC.

The auxiliary trenches may be formed to expose upper surface portions of the lower memorization layer between the first lower trenches. The patterning of the patterned lower memorization layer may comprise etching the second lower trenches in the lower memorization layer through the auxiliary trenches.

At least one auxiliary trench of the auxiliary trench mask stack may extend above a first lower trench and a first upper block above a first lower block located in the first lower trench. Hence, the at least one auxiliary trench may expose the first upper block. Due to the presence of the first upper block, the patterned lower memorization layer may, however, still be etched to form the second lower trenches without removing the earlier memorized trench interruption of the first lower trench (i.e., the first lower block therein). Moreover, the presence of the spacer layer makes it possible to ensure that the second lower trenches are separated from the first lower trenches.

Trenches of at least a subset of the second lower trenches may be arranged alternatingly with trenches of at least a subset of the first set of lower trenches. That is, among the trenches of these subsets, a second lower trench may be formed between a pair of first lower trenches, and vice versa.

Each trench of the aforementioned at least a subset of second lower trenches may be spaced from an adjacent trench of the aforementioned at least a subset of the first lower trenches by (only) a respective lower line formed of a respective third lower memorization layer portion masked by a respective sidewall spacer line. Hence, a minimum separation between the first and second lower trenches may be determined by a line width of the spacer lines.

The patterning method of the first aspect may be used in conjunction with a method for forming an interconnection structure. Hence, according to a second aspect, there is provided a method for forming an interconnection structure, comprising:

forming over an insulating layer a target memorization layer;

forming a first and a second set of trenches in the target memorization layer in accordance with a method according to the first aspect, wherein the underlying layer is the target memorization layer;

subsequent to forming the first and second set of trenches in the target memorization layer, etching first trenches in the insulating layer, underneath the first set of trenches in the target memorization layer, and second trenches in the insulating layer, underneath the second set of trenches in the target memorization layer, while the target memorization layer masks the insulating layer; and depositing a conductive material in the trenches in the insulating layer.

The method of the second aspect may further comprise prior to the patterning of the patterned upper memorization layer:

forming a via hole etch stack comprising a mask material filling the upper and lower trenches, and further comprising a resist layer, forming an opening in the via hole etch stack, the opening exposing an upper surface of a remaining portion of the upper memorization layer, etching back the exposed upper surface of the upper memorization layer to form an opening in the upper memorization layer, and sequentially etching back the lower and target memorization layers through the opening in the upper memorization layer to form an extended opening therethrough;

The method of the second aspect further comprises etching the insulating layer through the extended opening.

Thereby, a (second) via opening or via hole may be formed in the insulating layer. The via opening may, because of the patterning method, be self-aligned with the second set of trenches in the target memorization layer and consequently also with respect to the second trenches in the insulating layer.

The insulating layer may first be etched through the extended opening to form a preliminary via opening, which subsequently may be deepened during the aforementioned etching of (second) trenches in the insulating layer, thereby forming a final via opening.

The conductive material may be deposited to fill both the (final) via opening and the trenches in the insulating layer.

The mask material of the via hole etch stack may be a single deposited mask material layer or a stack of two or more deposited mask material layers. The mask material may be different from the upper layer material, the spacer material, the block material and the lower layer material. The mask material may further be different from one or more of the lower layer material, the target material layer and a material of the insulating layer. The mask material may be deposited to form a planarizing mask material layer filling the trenches and covering the patterned upper memorization layer. The mask material may be an organic spin-on material, such as SOC.

The etch back of the exposed upper surface of the patterned upper memorization layer may be performed using an etching process adapted to etch the patterned upper memorization layer at a greater rate than the mask material filling the upper trenches, and/or at a greater rate than the spacer material. This facilitates an improved etch margin during the subsequent sequential etch back of the memorization layers.

The exposed upper surface of the upper memorization layer may be located between a pair of upper trenches, and wherein a width of the opening in the via hole etch stack may exceed a spacing between the pair of upper trenches. This facilitates a relaxed printing of the opening in the via hole etch stack.

The method may further comprise prior to the patterning of the patterned upper memorization layer:

forming a via hole etch stack comprising a mask material filling the lower and the upper trenches, and further comprising a resist layer, forming an opening in the via hole etch stack, the opening exposing a bottom surface of a selected first lower trench, the opening exposing spacer layer portions on opposite sides of the selected first lower trench, etching back the exposed bottom surface to form an opening in the target memorization layer.

The method further comprises etching the insulating layer through the opening in the target memorization layer.

Thereby, a (first) via opening or via hole may be formed in the insulating layer. The via opening may, because of the patterning method, be self-aligned with the first set of trenches in the target memorization layer and consequently also with respect to the first trenches in the insulating layer.

The insulating layer may first be etched through the opening to form a preliminary via opening, which subsequently may be deepened during the aforementioned etching of (first) trenches in the insulating layer, thereby forming a final via opening.

The insulating layer may be etched through the opening immediately following the forming of the opening in the target memorization layer. However, if also a second via opening is to be formed as discussed above, it is also possible to perform the etching of the insulating layer through the opening in the target memorization layer (to form the first via opening) and through the extended opening (to form the second via opening) simultaneously.

The conductive material may be deposited to fill both the (final) via opening and the trenches in the insulating layer.

The mask material of the via hole etch stack may be a single deposited mask material layer or a stack of two or more deposited mask material layers. The mask material may be different from the upper layer material, the spacer material, the block material and the lower layer material. The mask material may further be different from one or more of the target memorization layer and the insulating layer. The mask material may be deposited to form a planarizing mask material layer filling the trenches and covering the patterned upper memorization layer. The mask material may be an organic spin-on material, such as SOC.

Forming the opening in the via hole etch stack may comprise etching the mask material using an etching process adapted to etch the mask material at a greater rate than the spacer material. This facilitates the opening to be self-aligned to the first set of lower trenches.

BRIEF DESCRIPTION OF THE FIGURES

The above, as well as additional objects, features, and aspects of the disclosure, will be better understood through the following illustrative and non-limiting detailed description, with reference to the appended drawings. In the drawings, like reference numerals will be used for like elements unless stated otherwise.

FIGS. 1-28 illustrate a process flow of a patterning method.

FIG. 1 illustrates a perspective view of a section of a structure that is to be subjected to processing steps of a patterning method, in accordance with example embodiments.

FIG. 2 illustrates a block opening mask stack that has been formed over an auxiliary block mask layer of the structure, in accordance with example embodiments.

FIG. 3 illustrates block openings formed in the auxiliary block mask layer, in accordance with example embodiments.

FIG. 4 illustrates a block material conformally deposited over the auxiliary block mask layer, in accordance with example embodiments.

FIG. 5 illustrates the block layer after being subjected to an etch back, in accordance with example embodiments.

FIG. 6 illustrates the structure after removal of the auxiliary block mask layer, in accordance with example embodiments.

FIG. 7 illustrates an upper memorization layer formed over the lower memorization layer and first upper blocks, in accordance with example embodiments.

FIGS. 8-9 illustrate process steps of patterning the upper memorization layer to form a set of upper trenches in the upper memorization layer, in accordance with example embodiments.

FIG. 10 illustrates sidewall spacer lines formed along sidewalls of the upper trenches, in accordance with example embodiments.

FIG. 11 illustrates the lower memorization layer patterned to form first lower trenches therein, in accordance with example embodiments.

FIG. 13 illustrates an exposed bottom surface that has been etched back to form an opening in a target memorization layer, in accordance with example embodiments.

FIG. 14 illustrates the opening transferred into an insulating layer, in accordance with example embodiments.

FIG. 15 illustrates the structure after removing the via hole etch stack, in accordance with example embodiments.

FIG. 17 illustrates an exposed upper surface of a remaining portion of a patterned upper memorization layer etched back to form an opening in the patterned upper memorization layer, in accordance with example embodiments.

FIG. 18 illustrates the patterned lower memorization layer and a target memorization layer sequentially etched back through the opening in the patterned upper memorization layer, in accordance with example embodiments.

FIG. 19 illustrates the structure after removing the via hole etch stack, in accordance with example embodiments.

FIG. 20 illustrates an auxiliary block mask stack comprising a mask material and a resist layer, in accordance with example embodiments.

FIG. 21 illustrates the auxiliary block mask stack patterned to form second mask blocks, in accordance with example embodiments.

FIG. 22 illustrates the patterned upper memorization layer etched while the second mask blocks mask the patterned upper memorization layer, in accordance with example embodiments.

FIGS. 23-26 illustrate the patterning of the patterned lower memorization layer to form second lower trenches therein, in accordance with example embodiments.

FIG. 27 illustrates the target memorization layer masked by the upper blocks and the spacer lines, in accordance with example embodiments.

FIG. 28 illustrates a resulting structure subsequent to patterning the target memorization layer, in accordance with example embodiments.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for patterning an underlying layer will now be described with reference to FIGS. 1-28. The method will be described in connection with patterning a target memorization layer 12, which in turn may be used for the purpose of patterning trenches in an insulating layer 10. The trenches in the insulating layer 10 may be filled with a conductive material, such as a metal, to form conductive lines of an interconnection level of an interconnection structure, e.g., in the back-end-of-line (BEOL). It is, however, noted that the method has a more general applicability for patterning trenches in any layer. For example, the layer 12 to be patterned may be a semiconductor layer or a metal layer.

Figure 1:
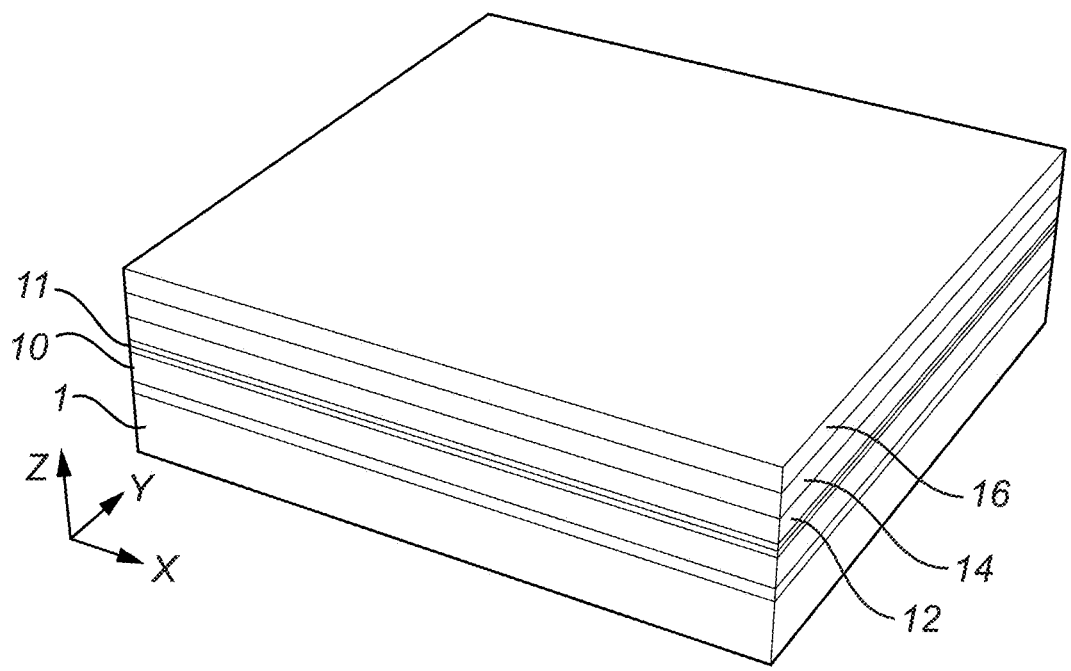

With reference to FIG. 1 there is shown, in perspective, a section of a structure that is to be subjected to the processing steps of the patterning method. The structure may extend laterally or horizontally beyond the illustrated section. The illustrated planes of section extending through the structure are common to all the figures unless stated otherwise. It is noted that the relative dimensions of the shown elements, in particular the relative thickness of the layers, is merely schematic and may, for the purpose of illustrational clarity, differ from a physical structure. In FIG. 1, directions X and Y indicate a first and a second horizontal direction, respectively, parallel to a main plane of extension and the main surface of the layers. Direction Z indicates a vertical direction, or equivalently a bottom-up direction or layer stacking direction, thus normal to the main plane of extension and the main surface of the layers. As may be appreciated, terms such as "over," "above," "below," "upper," "underlying," "underneath" should be understood as relative positions as viewed along the vertical direction. A "width" of a trench or a "line width" of a feature should be understood to refer to a dimension along the first horizontal direction X. A "longitudinal" or "length" dimension of, e.g., a trench should be understood to refer to a dimension along the second horizontal direction Y.

FIG. 1 depicts a layer stack comprising in the bottom-up direction an underlying target memorization layer 12 and a lower memorization layer 14. The lower memorization layer 14 may, as shown, be formed on the underlying target memorization layer 12. However, it is envisaged that interfacial layers, such as an adhesion layer, may be provided between the memorization layers 12 and 14. If an interfacial layer is present between the two memorization layers 12 and 14, the interfacial layer may be patterned in a same step as the higher layer, such as layer 14, or in a same step as the lower layer, such as layer 12.

The target memorization layer 12 may be a layer of a metal-comprising material such as a metal nitride, a metal carbide, or a metal oxide, for instance, TiN, $W_xC_y$, $Al_xO_y$, or $Al_xN_y$. The lower memorization layer 14 may be a layer of a dielectric material such as an oxide or a nitride or a carbide, for instance, $SiO_2$, SiCO, SiC, SiN, or SiCN. The memorization layers 12, 14 may, for instance, be deposited by chemical vapor deposition (CVD), atomic layer deposition (ALD), or physical vapor deposition (PVD).

As may be understood from the following, the memorization layer 14, and a further not yet formed upper memorization layer 20, may through patterning be used to "memorize" or "store" one or more parts of a final "target" pattern that is to be transferred to the target memorization layer 12. The "target pattern" may then be transferred to the insulating layer 10. Hence, "the memorization layers" 12, 14, 20 may instead be referred to as "patterning layers" 12, 14, 20.

As further shown in FIG. 1, the layer stack may be formed over an insulating layer 10. The insulating layer 10 may be of an oxide material, such as $SiO_2$, or another conventional lower-k dielectric. One or more interfacial layers 11, for example, an interface layer and/or an oxide capping layer, may optionally be present between the target memorization layer 12 and the insulating layer 10.

The insulating layer 10 may be formed over a substrate 1, for instance, a semiconductor substrate. An active device layer including semiconductor devices such as transistors may be fabricated on a main surface of the substrate 1. The active device layer may also be referred to as a front-end-of-line portion (FEOL-portion). The insulating layer 10 may be formed over (not shown) conductive structures, such as conductive lines of a lower interconnection level, or contact structures for devices, such as source/drain or gate contacts of semiconductor devices, as per se is known in the art.

FIGS. 1-6 illustrate process steps for forming first upper blocks 19 for defining trench interruptions for a first set of target trenches, which are to be patterned in the target memorization layer 12.

An auxiliary block mask layer 16 is formed over, or as shown on, the lower memorization layer 14. The auxiliary block mask layer 16 may, for example, be an oxide such as $SiO_2$, a metal-comprising material such as a metal nitride or a metal oxide, for instance, TiN, $Al_xN_y$, $Al_xO_y$, $TiO_x$, or $ZrO_x$, or a nitride or a carbide, for instance, SiCO or SiN. A further example is a-Si. The auxiliary block mask layer 16 may, for example, be deposited by CVD, ALD, or PVD.

Figure 2:
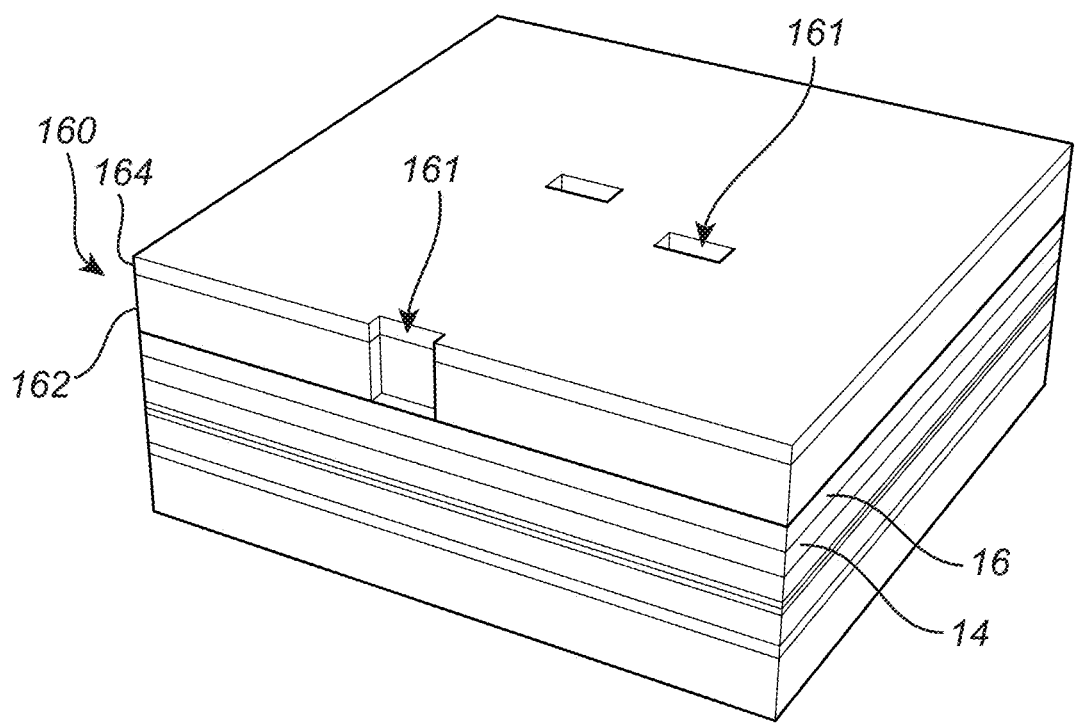

In FIG. 2, a block opening mask stack 160 has been formed over the auxiliary block mask layer 16. The block opening mask stack 160 may comprise a mask material 162 and a resist layer 164 formed over the mask material 162. The mask material 162 may, for instance, be an organic spin-on material such as SOC. The block opening mask stack 160 is patterned to form auxiliary block openings 161. The auxiliary block openings 161 may first be formed in the resist layer 164 by lithography and then transferred into the mask material 162 by etching. Although not shown, the auxiliary block opening mask stack 160 may comprise additional layers under the resist layer 164, such as one or more anti-reflective coatings such as SiOC layers and/or spin-on-glass layers. An alternative to a mask stack may be to form a resist layer directly on the auxiliary block mask layer 16.

As further shown in FIG. 3, block openings 17 may subsequently be formed in the auxiliary block mask layer 16 by etching the auxiliary block mask layer 16 through the auxiliary block openings 161, while the patterned auxiliary block opening mask stack 160 masks the auxiliary block mask layer 16. The block openings 17 may be etched using a suitable etching process, for instance, a dry etch, e.g., Reactive Ion Etching (RIE)

Figure 3:
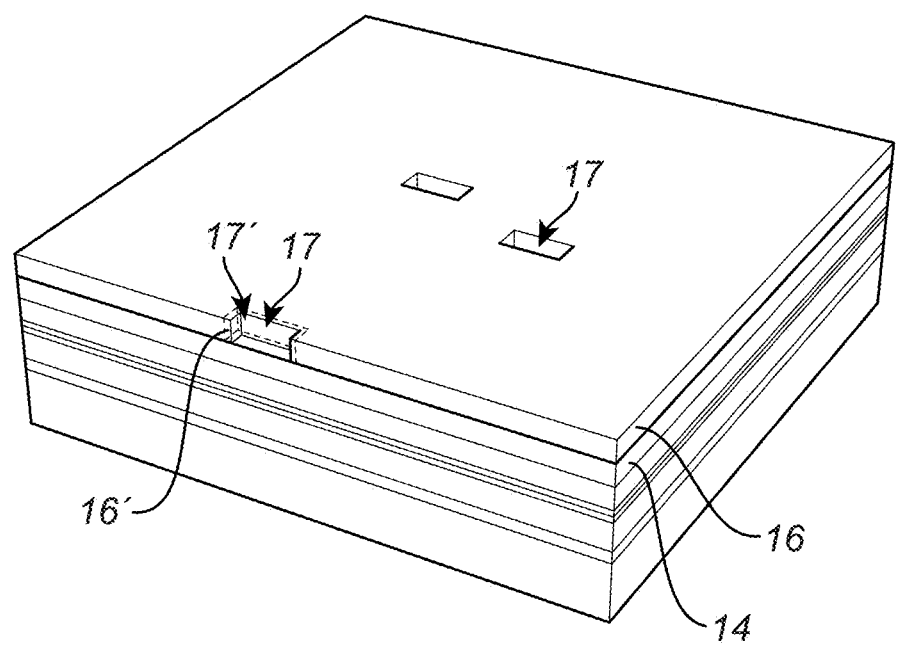

According to a variation also indicated in FIG. 3, forming block openings 17 may comprise first patterning initial block openings 17' in the auxiliary block mask layer 16 using lithography and etching. Subsequently, final block openings 17 may be formed by forming a liner layer 16' conforming to sidewalls of the initial block openings 17', thereby "shrinking" the initial block openings 17'. The liner layer 16' may be formed as a conformal liner layer, conveniently by ALD deposition of a same material as the auxiliary block mask layer 16. The (conformal) liner layer may optionally be subjected to a top-down anisotropic etch back or polishing step (e.g., chemical mechanical polishing—CMP) to remove liner layer portions from horizontally oriented surfaces such that liner layer portions on the (vertically oriented) sidewalls of the initial block openings remain. Accordingly, liner layer material may be removed from a bottom surface of the block openings 17.

Figure 4:
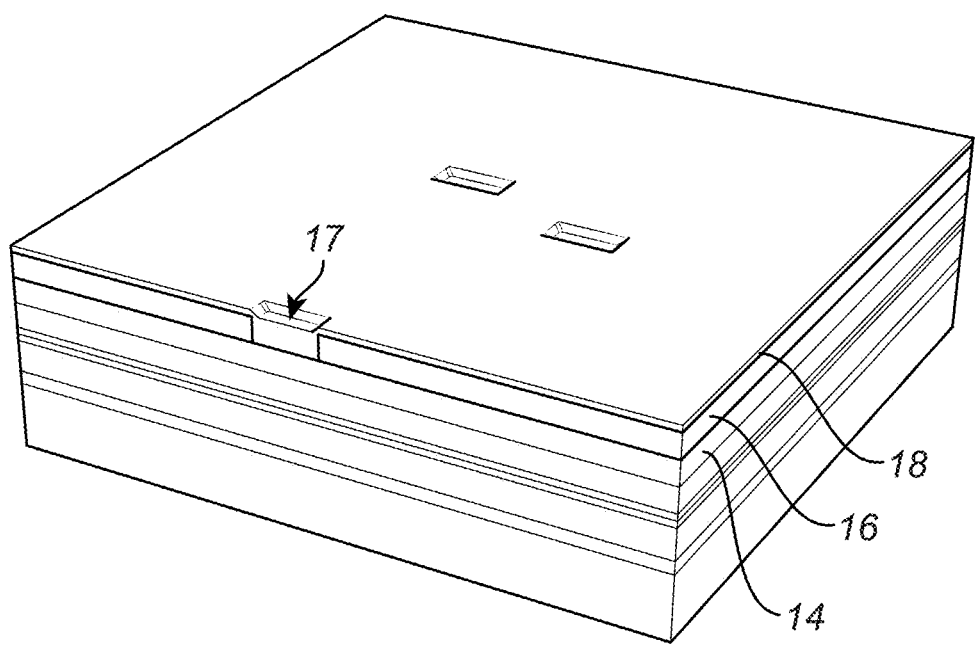

In FIG. 4, a block material has been conformally deposited over the auxiliary block mask layer 16. The block material forms a conformal block layer 17 covering the auxiliary block mask layer 16 and filling the block openings 17. The block layer 17 may conform to sidewalls of the block openings 17. The block material may be deposited with such a thickness that the block material deposited on the sidewalls merges in the block openings 17.

The critical dimension (CD) of a block opening 17 may refer to a dimension of the block opening along the second horizontal direction Y. This may be understood considering the purpose of the block openings 17 is to allow formation of blocks, which in turn will be used to define trench interruptions (i.e., to define trenches with a tip-to-tip configuration). Accordingly, depositing the block material with a thickness of at least half the CD of the block openings 17 allows the block layer portions 18 deposited on respective opposite sidewalls of the block openings 17 to merge, and thus close the block openings 17.

The block material may generally be different from each one of the lower layer material and the upper layer material (which is to be deposited). The block material may, for example, be a metal-nitride or metal-oxide such as TiN, TiO$_x$, ZrO$_x$, AlO$_x$, or AlN. Ru represents a further example. The block material may be deposited, e.g., by ALD. For improved mask budget during subsequent patterning steps, the block material may be selected as a material different from the target memorization layer 12.

Figure 5:
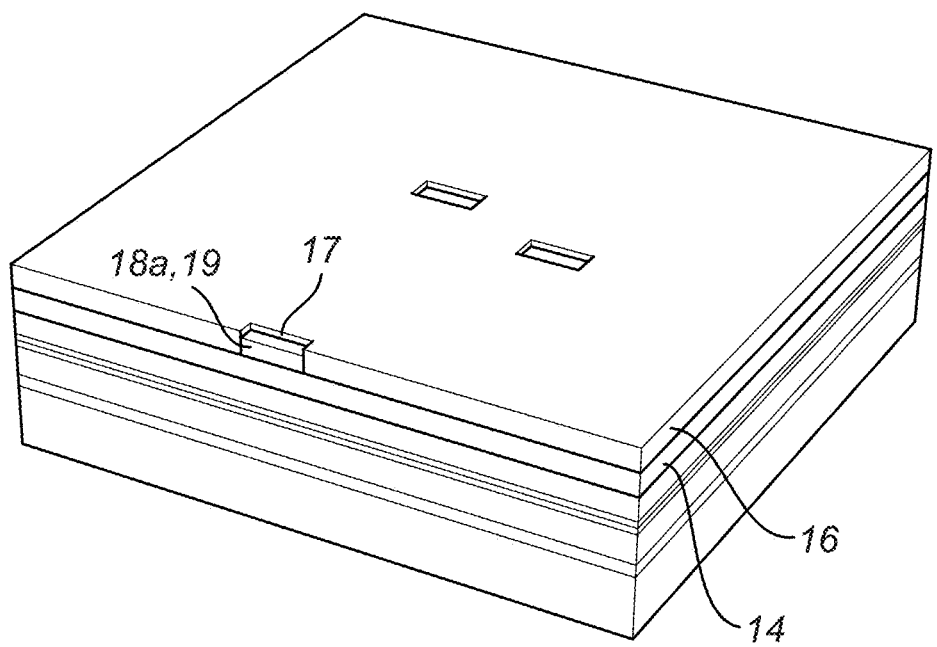

In FIG. 5, the block layer 17 has been subjected to an etch back such that block material deposited outside the block openings 17 is removed and block material remains in the block openings 17 to form the first upper blocks 19. The etch back may comprise dry etching, e.g., using RIE.

According to a variation, first upper blocks 19 may instead be formed by depositing a block material (e.g., in a non-conformal manner) over the auxiliary block mask layer 16 and in the block openings 17, and subsequently removing block material deposited outside the block openings, e.g., by a top-down anisotropic etch back (e.g., RIE) or polishing step (e.g., CMP). Block material may hence be removed from an upper surface of the auxiliary block mask layer 16 but be preserved in the block openings 17 to form the first upper blocks 19.

Figure 6:
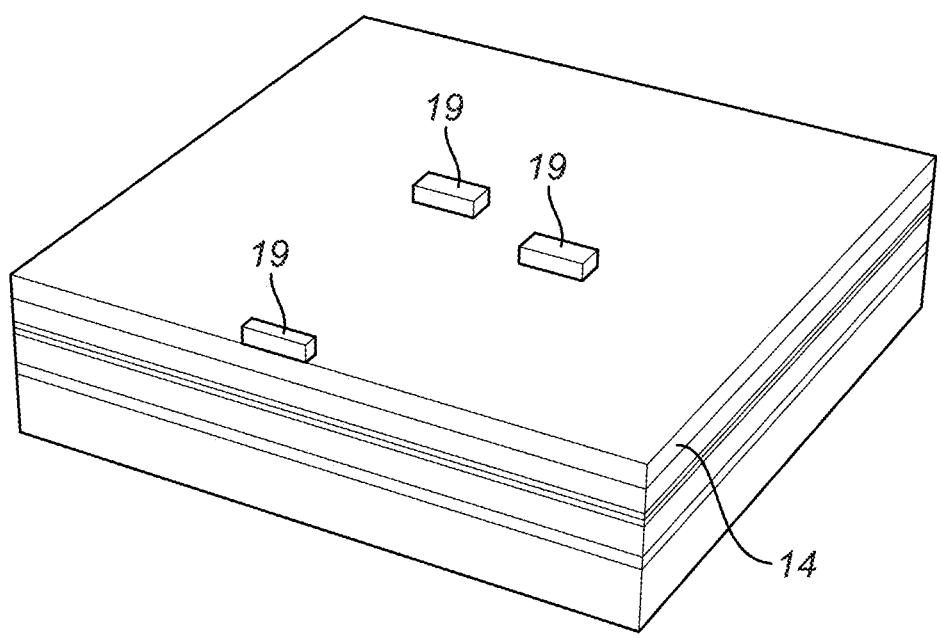

In FIG. 6, the auxiliary block mask layer 16 has been removed. The auxiliary block mask layer 16 may be removed by etching the auxiliary block mask layer 16 selectively to the first upper blocks 19. A suitable dry or wet etching process providing a sufficient selectivity may be employed.

Figure 7:
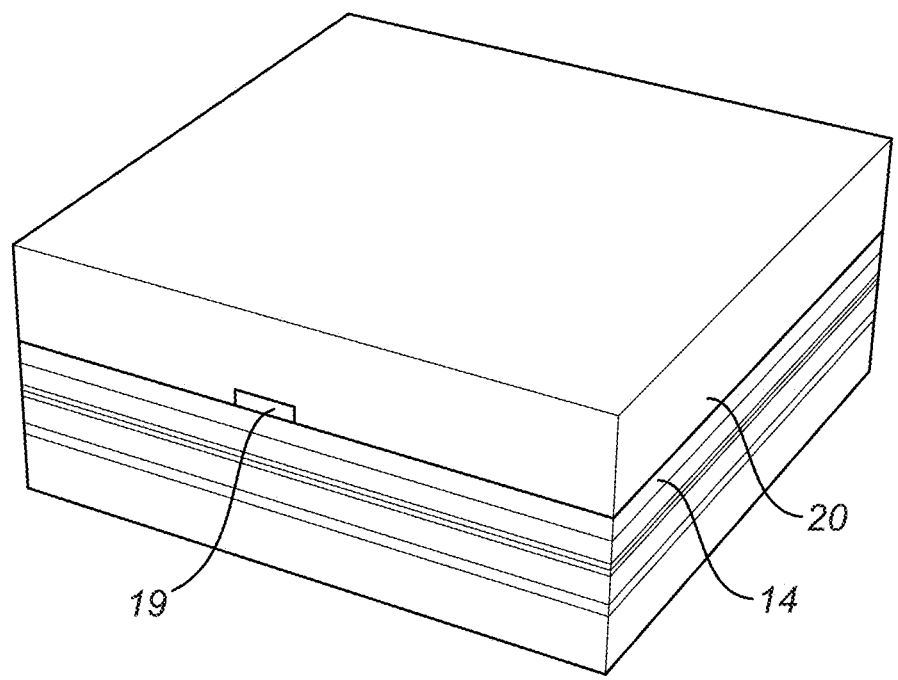

In FIG. 7, an upper memorization layer 20 has been formed over the lower memorization layer 14 and the first upper blocks 19. In FIG. 7, the upper memorization layer 20 is depicted with a planar upper surface. However, it should be noted that due to the presence of the first upper blocks 19, the upper surface of the upper memorization layer 20 may present a (slightly) varying topography. If such a topography variation is not desired, the upper surface may be planarized, e.g., by CMP before subsequent process steps.

The upper memorization layer 20 may, for example, be an a-Si layer, deposited, e.g., by CVD, ALD, or PVD. A non-limiting example of a combination of materials of the memorization layers 12, 14, 20, and the first upper blocks 19 is: a target memorization layer 12 of TiN, a lower memorization layer 14 of SiN, an upper memorization layer 20 of a-Si, and first upper blocks 19 of TiN.

Figure 8:
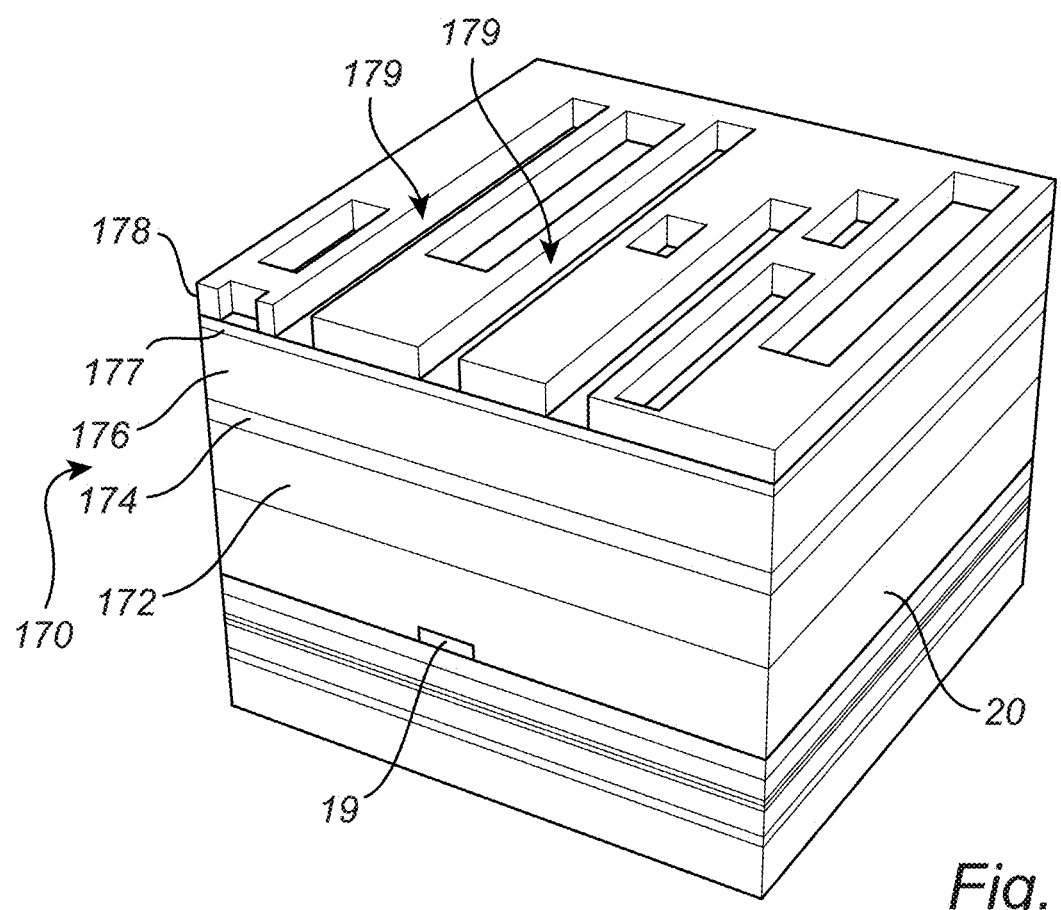
Figure 9:
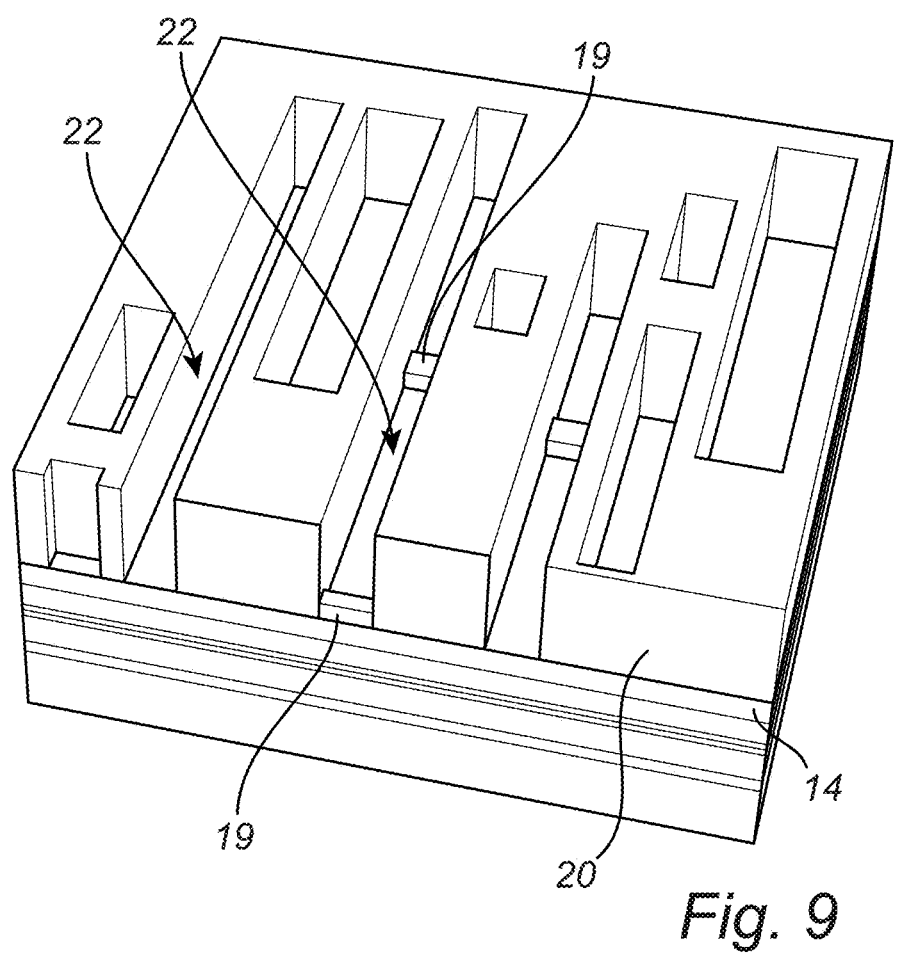

FIGS. 8-9 illustrate process steps of patterning the upper memorization layer 20 to form a set of upper trenches 22 in the upper memorization layer 20. The upper trenches 22 are formed using lithography and etching. As shown in FIG. 8, a (first) auxiliary trench mask stack 170 comprising a mask material 172 and a resist layer 178 is formed over the upper memorization layer 20. The mask material 172 may, for instance, be an organic spin-on material such as SOC. The auxiliary trench mask stack 170 may, as shown, further comprise additional layers 174, 176, 177 under the resist layer 178, such as one or more anti-reflective coatings such as SiOC layers and/or spin-on-glass layers.

The auxiliary trench mask stack 170 is patterned to form auxiliary trenches 179. The auxiliary trenches 179 may first be formed in the resist layer 178 by lithography and then transferred into the mask material 172 by etching. The upper trenches 22 may thereafter be formed by etching the upper memorization layer 20 through the auxiliary trenches 179, while the patterned auxiliary trench mask stack 170 masks the upper memorization layer 20. The upper trenches 22 may be etched using a suitable etching process, for instance, a dry etch, e.g., Reactive Ion Etching (RIE). For example, etching chemistries comprising Bromine (e.g., HBr), Chlorine (e.g., Cl$_2$), or Fluorine (e.g., SF$_6$, CF$_4$) may be tuned to achieve a selective "a-Si etch," i.e., selective etching of a-Si with respect to the auxiliary trench mask stack 170, e.g., comprising organic spin-on material such as SOC.

FIG. 9 shows the thusly patterned upper memorization layer 20 with the upper trenches 22 formed therein, after removing the auxiliary trench mask stack 170. For example, removing the auxiliary trench mask stack 170 may comprise an "SOC etch," such as an RIE using an Ar- or He-diluted oxygen-comprising etching chemistry, or an N$_2$/H$_2$ based etching chemistry. The upper trenches 30 may, as shown, expose upper surface portions of the lower memorization layer 14. Each upper trench 22 is formed above a region of the target memorization layer 12 (and insulating layer 10) where a first target trench 96 is to be formed (c.f. e.g., FIG. 27). As shown, the upper trenches 22 may be formed with various widths (along the first horizontal direction X) and various longitudinal dimensions (along the second horizontal direction Y). The upper trenches 22 may extend in parallel to the second horizontal direction Y.

Upper trenches 22 may, as shown, extend across and exposed one or more first upper blocks 19. Conversely, a first upper block 19 is formed along an upper trench 22. A first upper block 19 may thus define a trench interruption along an upper trench 22.

Figure 10:
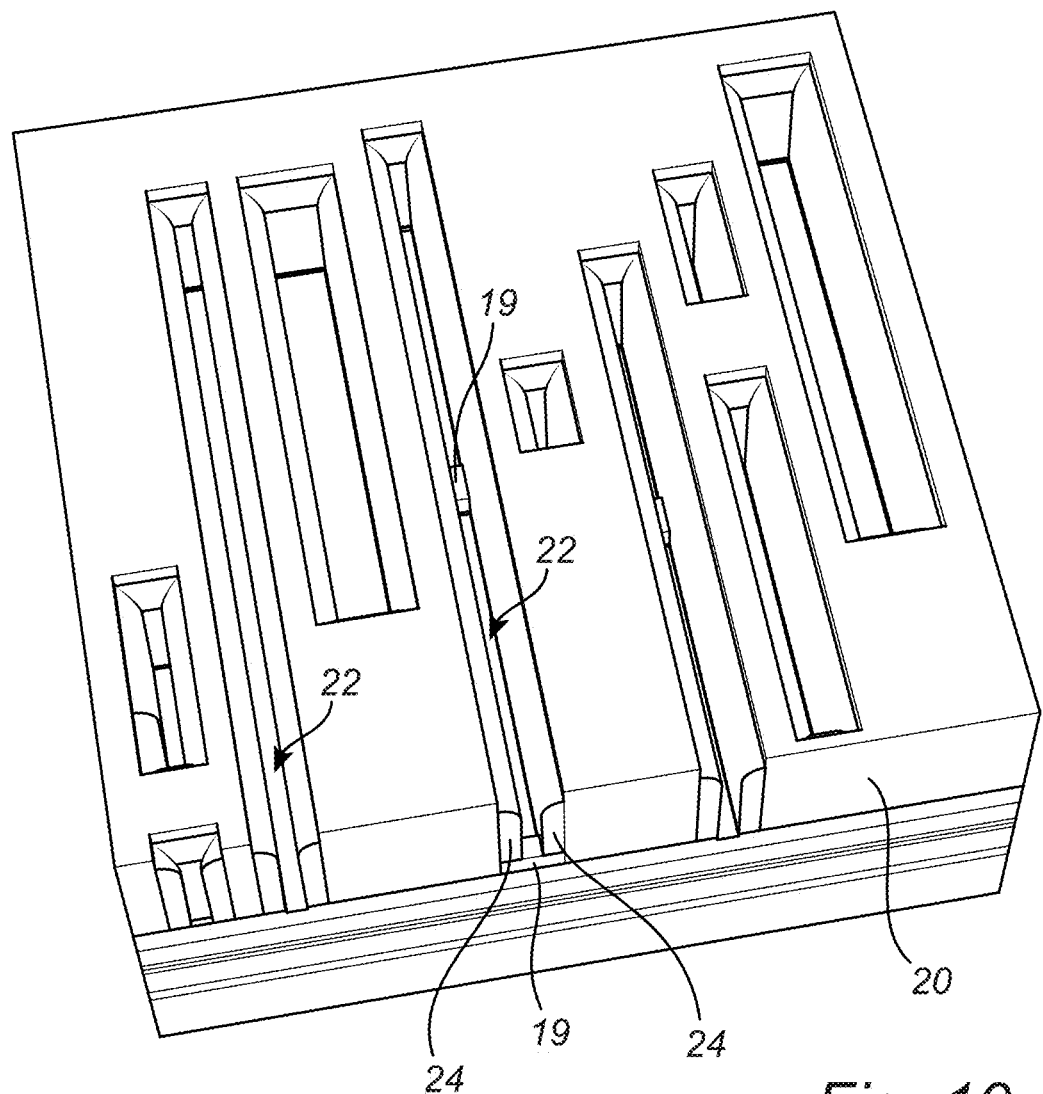

In FIG. 10, sidewall spacer lines 24 have been formed along sidewalls of the upper trenches 22. The spacer lines 24 may be formed in a sidewall spacer deposition process by an ALD-deposited material such as oxide, e.g., SiO$_2$ or a metal oxide layer, e.g., AlO$_x$ or TiO$_x$, or a carbide or nitride, e.g., SiCO, SiN, AlN, AlON, or SiCN. The spacer lines 24 may, as shown in FIG. 10, conform to the sidewalls of each upper trench 22. In other words, the spacer lines 24 may cover and extend along the sidewalls of the upper trenches 22. As further indicated in FIG. 10, spacer lines 24 may also form on end walls of the upper trenches 22, and on sidewalls of the first upper blocks 19. Such end wall spacer portions may thus connect the sidewall spacer lines 24 formed on mutually opposite sidewalls of each respective upper trench 22.

Figure 11:
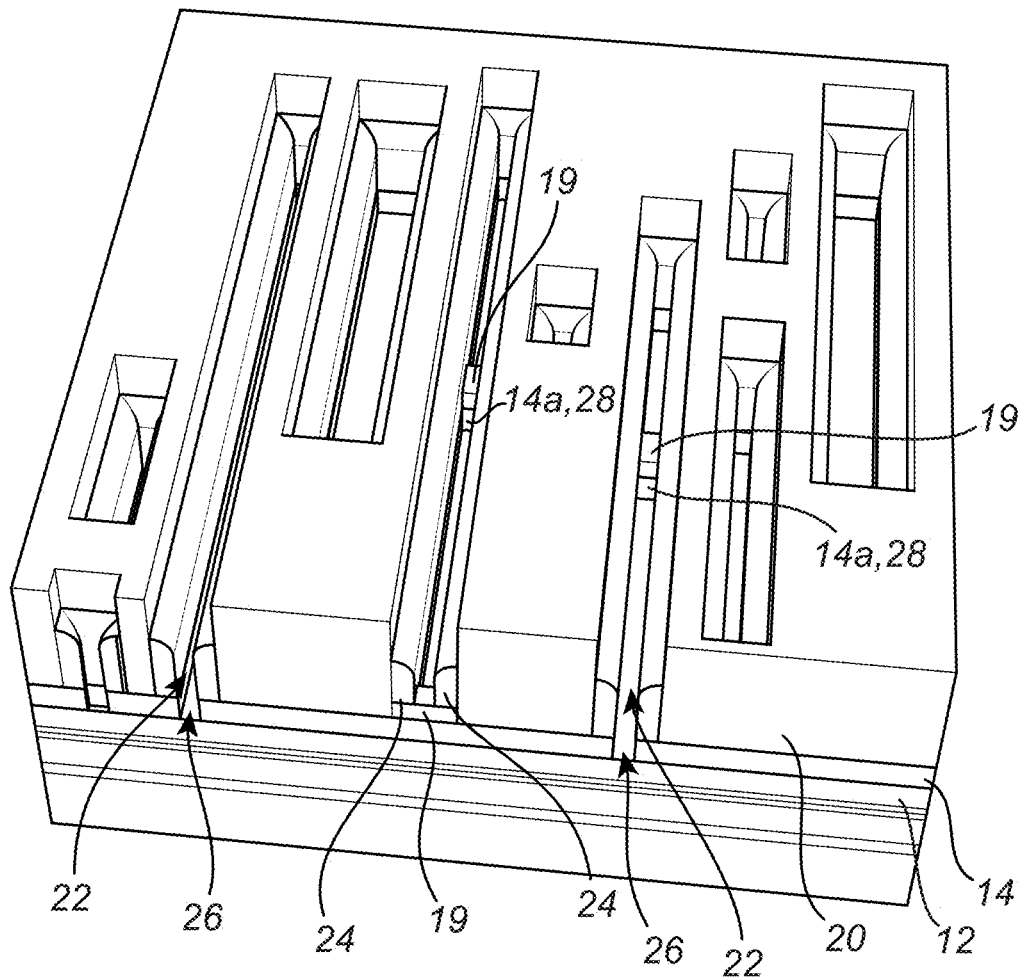

In FIG. 11, the lower memorization layer 14 has been patterned to form first lower trenches 26 therein. The patterning may comprise etching the lower memorization layer 14 while the patterned upper memorization layer 20, the spacer lines 24 and the first upper blocks 19 mask the lower memorization layer 14. In other words, the patterning may comprise vertically etching back upper surface portions of the lower memorization layer 14 underneath or exposed in the upper trenches 22 (i.e., upper surface portions which are not masked by the first upper blocks 19 or spacer lines 24). The lower trenches 26 may, as shown, expose upper surface portions of the target memorization layer 12.

As may be seen from FIG. 11, underneath each first upper block 19, a first lower block 28 has been formed by a respective first lower memorization layer portion 14a masked by the first upper block 19 during the etching of the lower memorization layer 14. Hence, a respective first lower memorization layer portion 14a may be preserved underneath each first upper block 19. Accordingly, at least a subset of the first lower trenches 26 are interrupted by a respective first lower block 28.

The patterning of the lower memorization layer 14 may comprise etching using an etching process, such as a dry etching process, allowing the lower memorization layer 14 to be etched at a greater rate than the upper memorization layer 20, the spacer lines 24 and the first upper blocks 19. For instance, a SiN layer may be etched at a greater rate than each one of TiN, a-Si and an oxide such as a silicon or metal oxide (e.g., $SiO_2$ or $TiO_x$) by RIE using, e.g., a fluorine-based chemistry (e.g., $CHF_3$, $CH_3F$, $C_4F_8$, $CF_4$, $CH_2F_2$), optionally using a continuous wave plasma, plasma pulsing or a cycling process (e.g., Quasi-Atomic Layer etching).

After the patterning of the lower memorization layer 14, the first upper blocks 19 and the spacer line-provided upper trenches 22 have thus been "memorized" in the patterned lower memorization layer 14.

A (first) via formation process for patterning (first) via openings aligned with the first set of target trenches 96 in the target memorization layer 12, and a (second) via formation process for patterning (second) via openings aligned with the second set of target trenches 98 in the target memorization layer 12, will now be described with reference to FIGS. 12-15 and 16-18, respectively. If it is not desired to form first and/or second via openings, the relevant steps may be omitted. The method may thereafter proceed to FIG. 19.

Figure 12A:
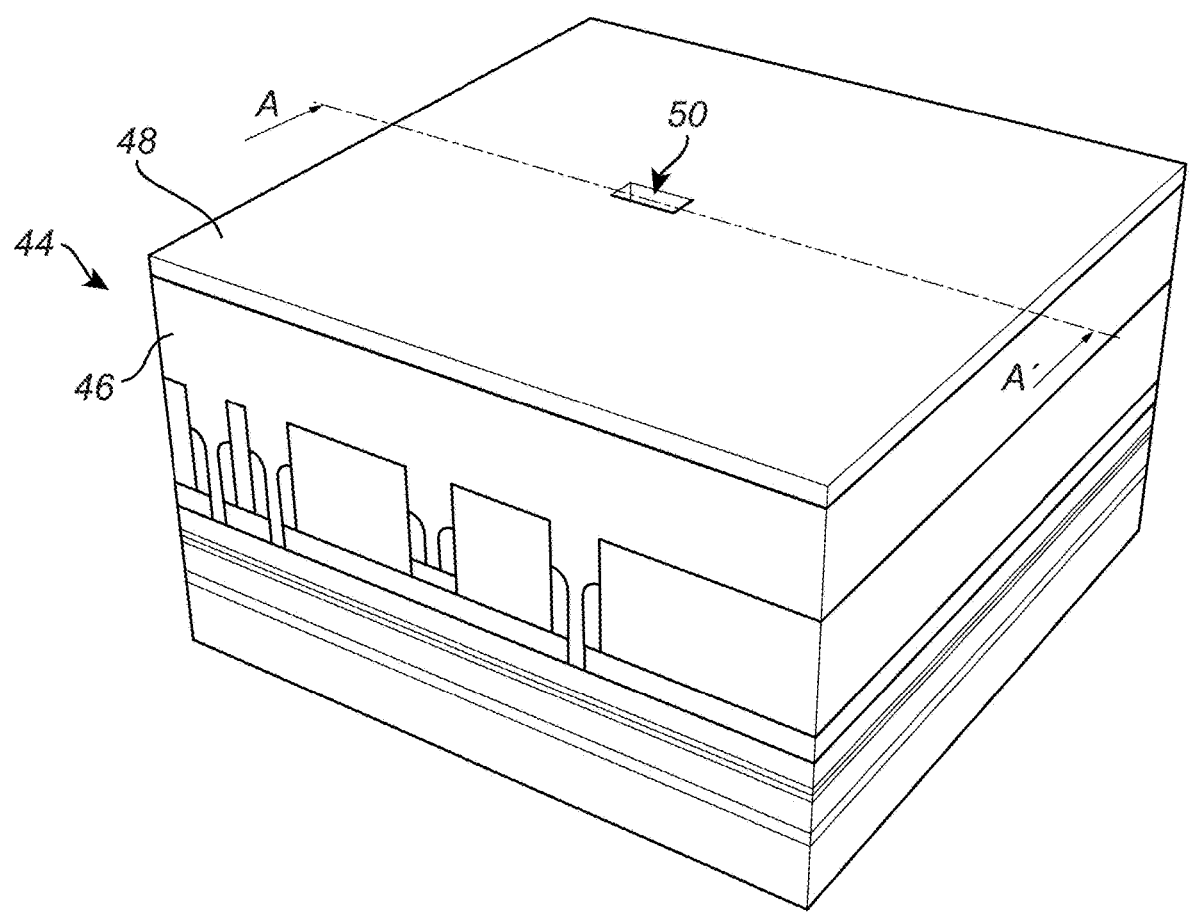
FIG. 12a illustrates an opening formed in the structure, in accordance with example embodiments.
Figure 12B:
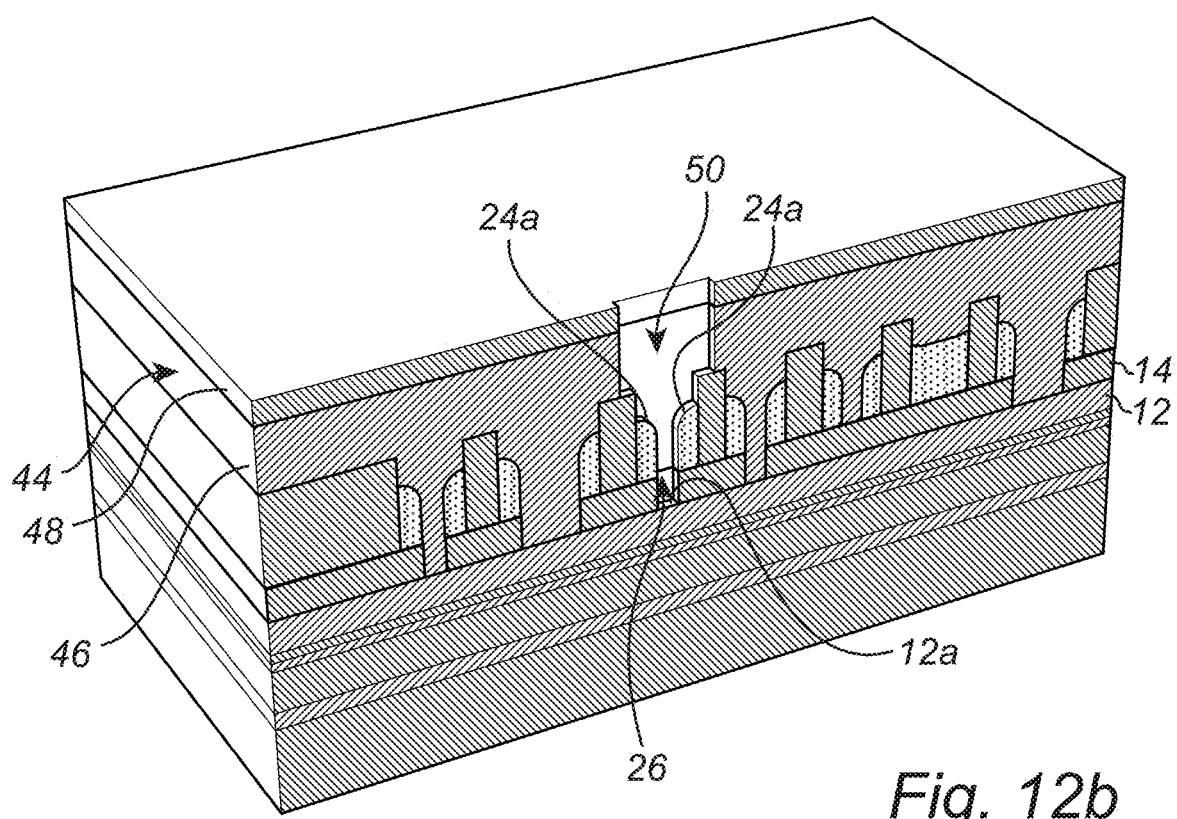
FIG. 12b illustrates a cross-section of the structure along section A-A' of FIG. 12a, in accordance with example embodiments.

FIG. 12b shows a cross-section of the structure along the line A-A' indicated in FIG. 12a. A (first) via hole etch stack 44 has been formed over the structure. The via hole etch stack 44 may comprise a mask material 46 filling the upper and first lower trenches 22, 26. The mask material 46 may form a planarizing layer covering the patterned upper memorization layer 20. The mask material 46 may be SOC or other organic spin-on layer. The via hole etch stack 44 may further comprise a resist layer 48, formed over the mask material 46. Although not shown, the via hole etch stack 44 may comprise additional mask materials, such as one or more anti-reflective coatings, such as SiOC layers, and/or a spin-on-glass layer between a SOC layer and the resist layer 48.

An opening 50 has been formed in the via hole etch stack 44 by lithography and etching. The opening is formed above a "selected" first lower trench 26 at a position underneath which a via opening is desired. The opening 50 may extend through the via hole etch stack 44 to expose a bottom surface of the selected first lower trench 26, the bottom surface 12a formed, e.g., by an upper surface portion of the target memorization layer 12.

Etching the mask material 46 using an etching process adapted to etch the mask material 46 at a greater rate than the spacer lines 24 allows the opening 50 to be self-aligned with respect to the spacer lines 24. The opening 50 may, by extension, be self-aligned also with respect to the selected first lower trench 26. A relaxed CD opening 50 may hence be lithographically defined in the resist layer 48 and transferred into the mask material 46. During etching of the mask material 46, the opening 50 may thus expose spacer layer portions 24a on opposite sides of the selected first lower trench 26. For example, an organic spin-on material such as SOC may be etched at a greater rate than an oxide spacer using a SOC etch, as discussed above. After forming the opening 50 the resist layer 48 may be removed. FIG. 12a, 12b shows one opening 50 however, as may be appreciated, any number of openings 50 may be formed, in accordance with the number of via openings desired.

Figure 13:
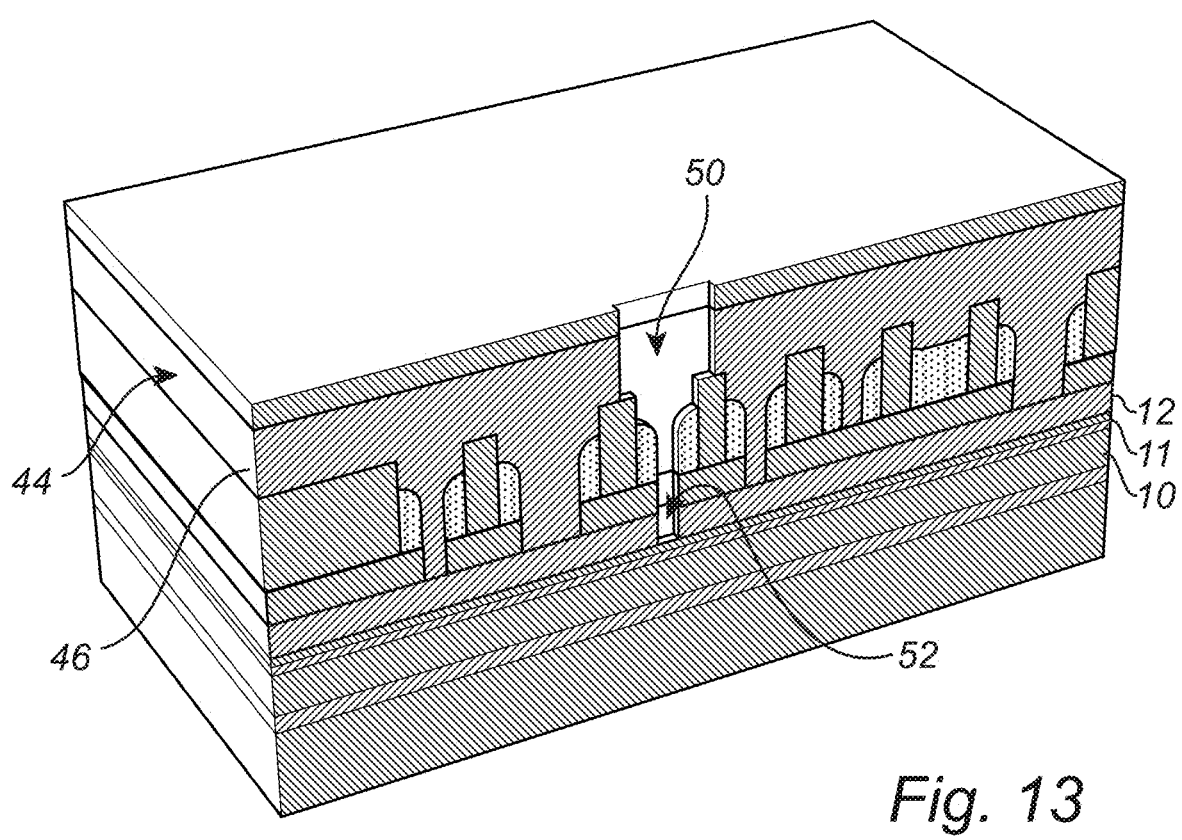
Figure 14:
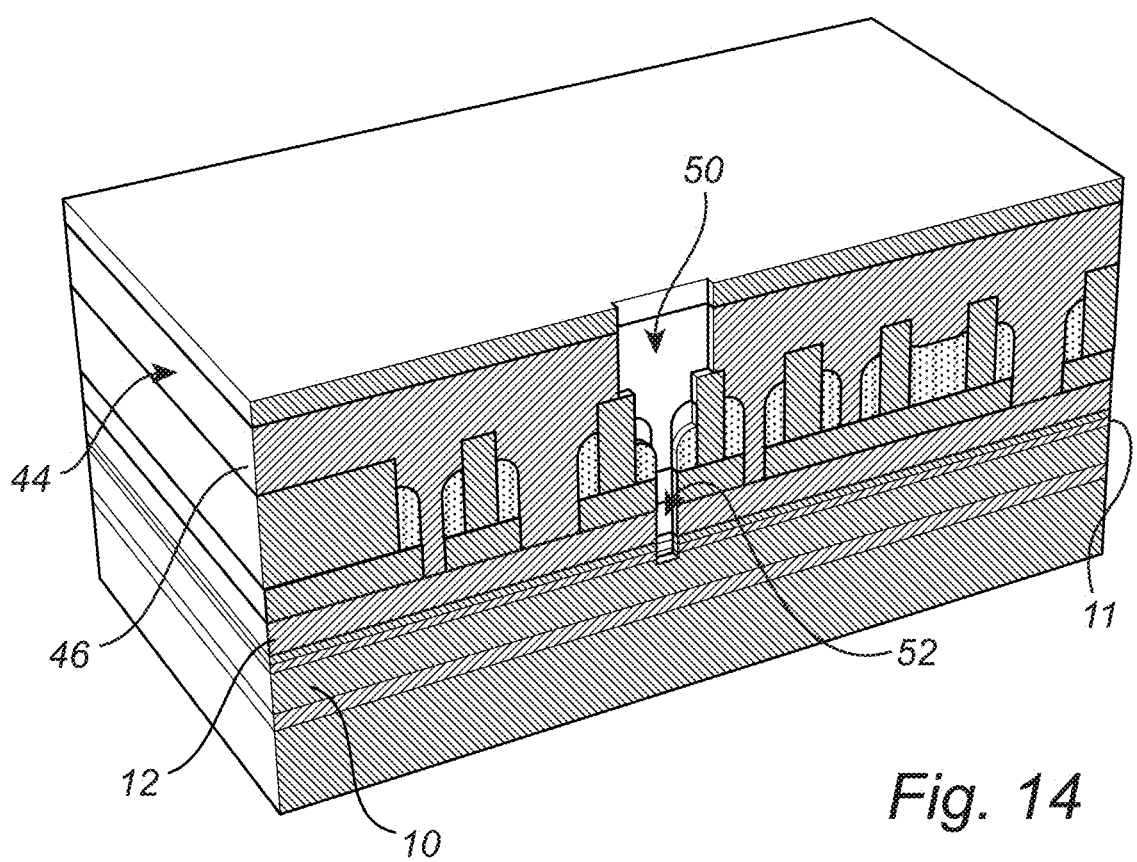
Figure 15:
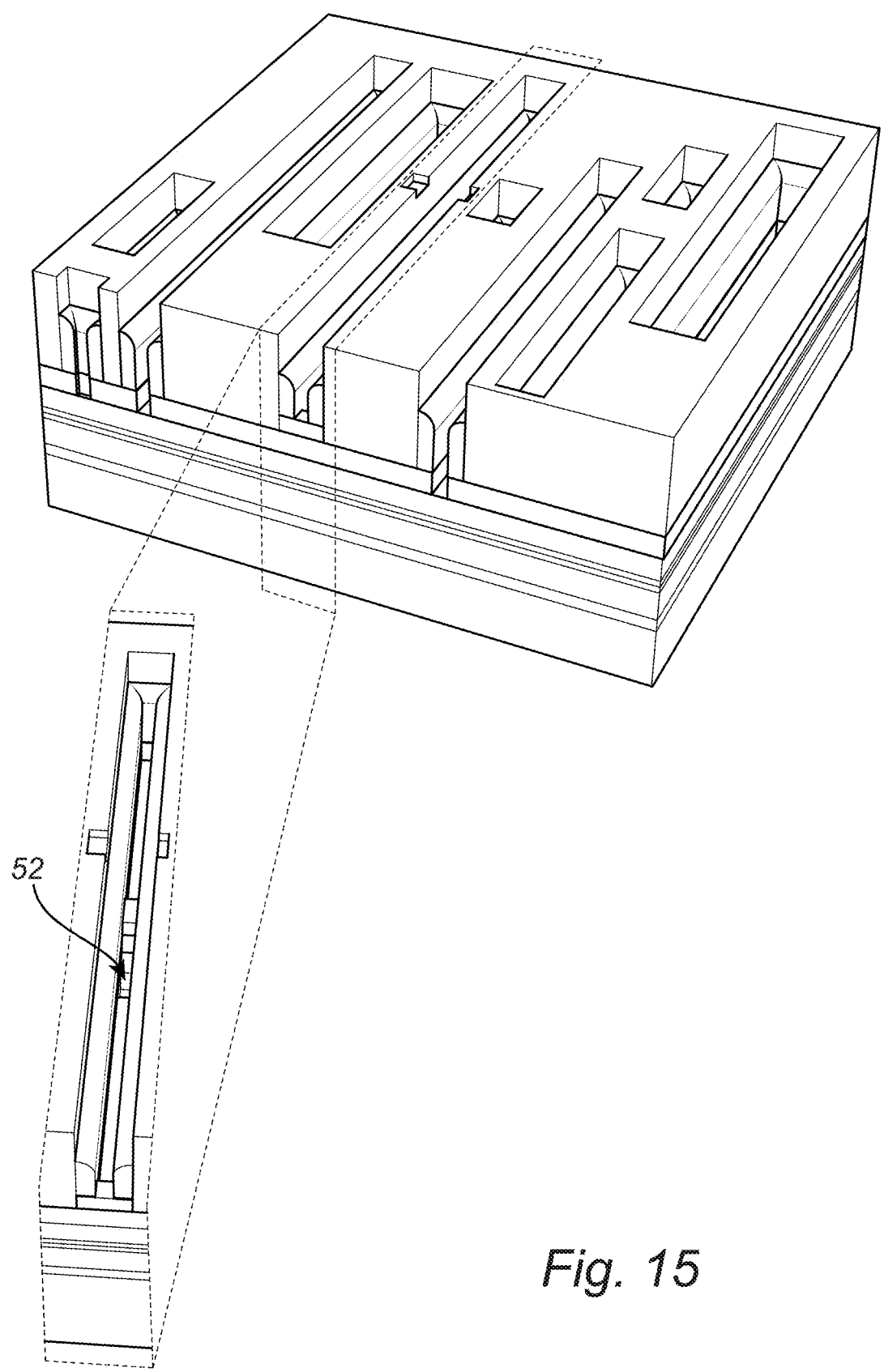

In FIG. 13, the exposed bottom surface 12a has been etched back to form an opening 52 in the target memorization layer 12. The opening 52 may, as further shown in FIG. 14, be also transferred into the insulating layer 10, and any interfacial layers 11, if present, by etching the layer(s) 10/11 through the opening 52 in the target memorization layer 12. A depth of the opening 52 in the layer(s) 10/11 may at this stage be of only an initial depth, and deepened at a later stage, such as during the etching of trenches in the insulating layer 10. FIG. 15 shows the structure after removing the via hole etch stack 44.

Figure 16A:
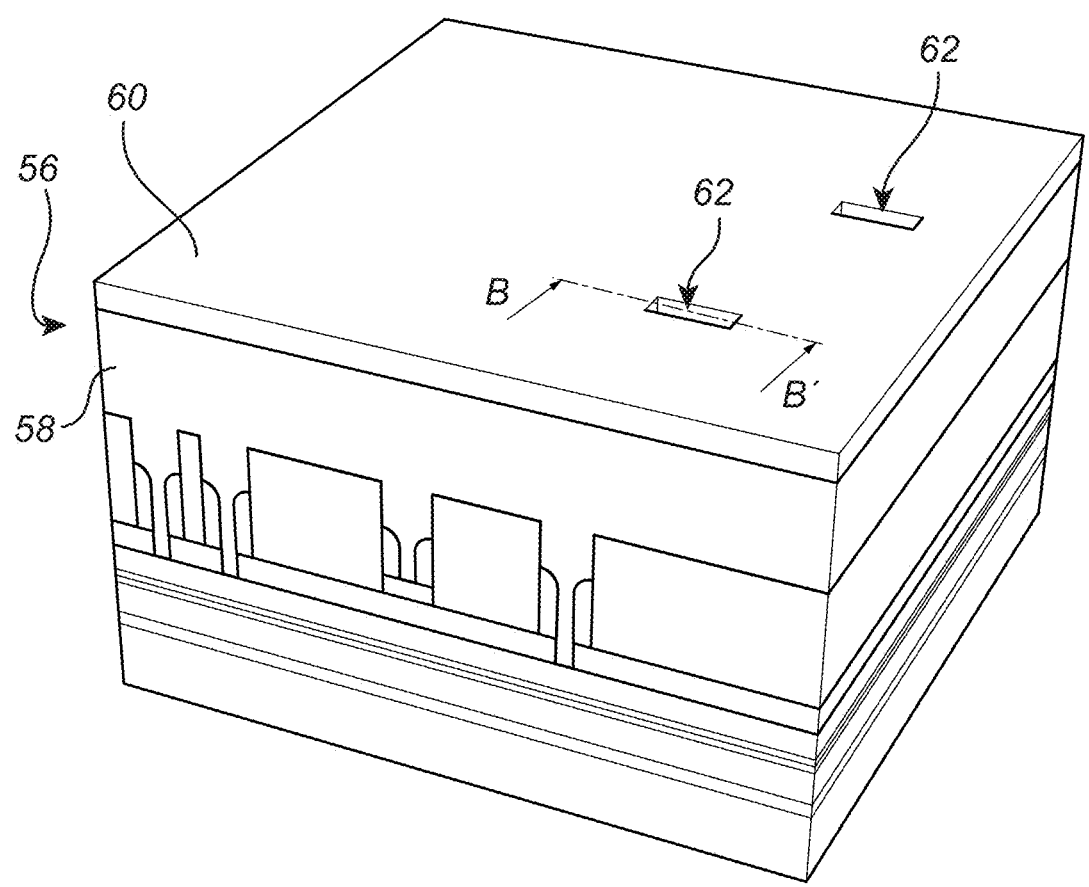
FIG. 16a illustrates another opening formed in the structure, in accordance with example embodiments.
Figure 16B:
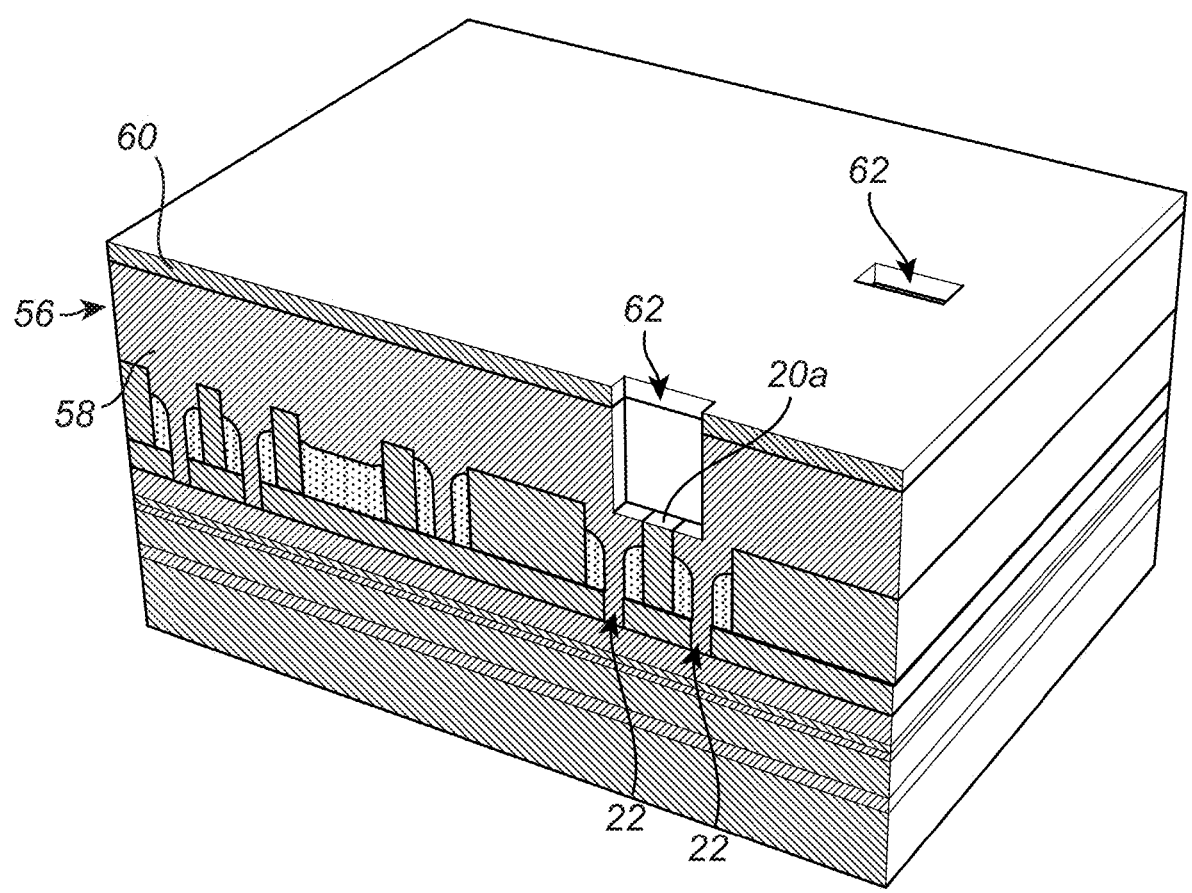
FIG. 16b illustrates a cross-section of the structure along section B-B' of FIG. 16a, in accordance with example embodiments.

FIG. 16b shows a cross-section of the structure along the line B-B' indicated in FIG. 16a. A (second) via hole etch stack 56 has been formed over the structure. The via hole etch stack 56 may comprise a mask material 58 filling the upper and first lower trenches 22, 26. The mask material 58 may form a planarizing layer covering the patterned upper memorization layer 20. The mask material 58 may be a SOC or other organic spin-on material. The via hole etch stack 56 may further comprise a resist layer 60. Similar to the discussion of the via hole etch stack 44, additional mask materials (e.g., anti-reflective coatings) may be present in the via hole etch stack 44.

Openings 62 have been formed in the via hole etch stack 56 by lithography and etching. Reference will now be made to the opening 62 through which the cross-section extends. However, the following description applies correspondingly to any further opening 62. The opening 62 is formed above a remaining portion of the patterned memorization layer 12 (where a second lower trench is to be formed) at a position underneath which a via opening is desired. The remaining portion of the patterned memorization layer 12 may, as shown, be located between a pair of upper trenches 22. The opening 62 may extend through the via hole etch stack 56 to expose an upper surface 20a of a remaining portion of the patterned upper memorization layer 20. To preserve mask budget, the etching of the mask material 58 may be stopped when the upper surface 20a is exposed.

Figure 17:
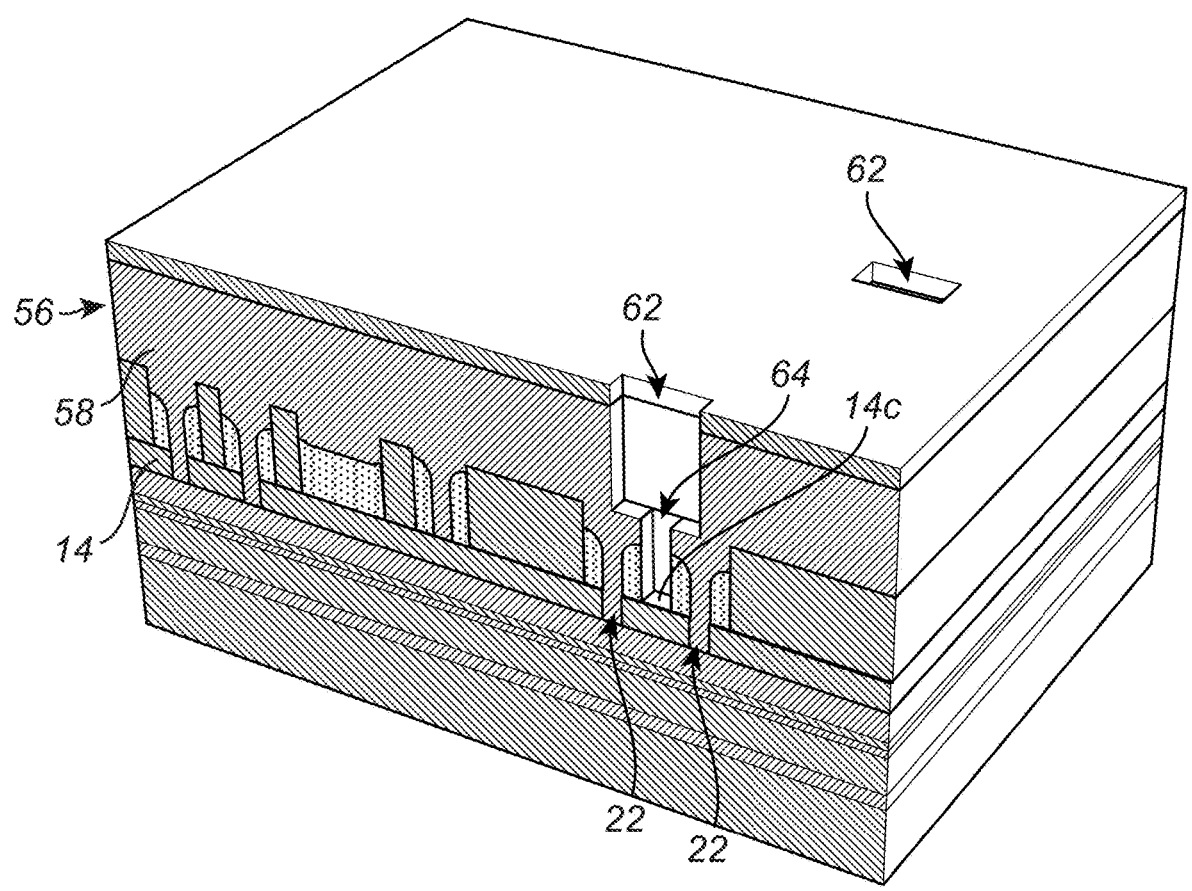

In FIG. 17, the exposed upper surface 20a of the remaining portion of the patterned upper memorization layer 20 has been etched back to form an opening 64 in the patterned upper memorization layer 20. The opening 64 may thus expose an upper surface portion 14c of the lower memorization layer 14. Etching the patterned upper memorization layer 20 using an etching process adapted to etch the patterned upper layer memorization layer 20 at a greater rate than the mask material 58 and the spacer lines 24 (i.e., of the spacer material) allows the opening 64 to be self-aligned with respect to the spacer lines 24. A relaxed CD opening 62 may hence be lithographically defined in the resist layer 60 and transferred into the mask material 58. By extension, and as illustrated in FIG. 17, a width of the opening 62 in the via hole etch stack 56 may exceed a spacing between the pair of upper trenches 22 on either side of the remaining portion of the patterned upper memorization layer 20.

Figure 18:
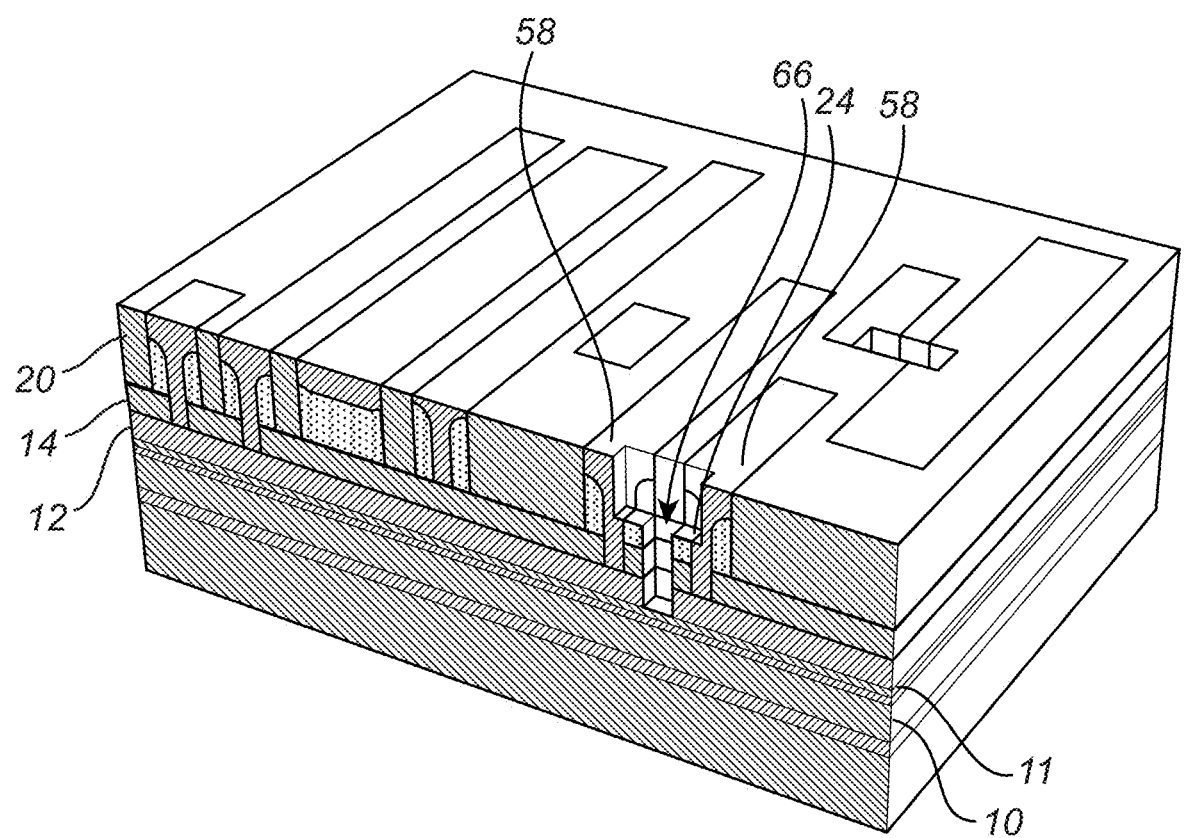

In FIG. 18, the patterned lower memorization layer 14 and the target memorization layer 12 have been sequentially etched back through the opening 64 in the patterned upper memorization layer 20. An extended opening 66 extending through the memorization layers 14, 12 may thereby be formed. If the opening 62 in the via hole etch stack 56 forms a relaxed CD opening, as discussed above, an etch back of the upper surface portions of the mask material 58 and portions of the spacer lines 24 may also take place during the etching of the opening 64.

Figure 19:
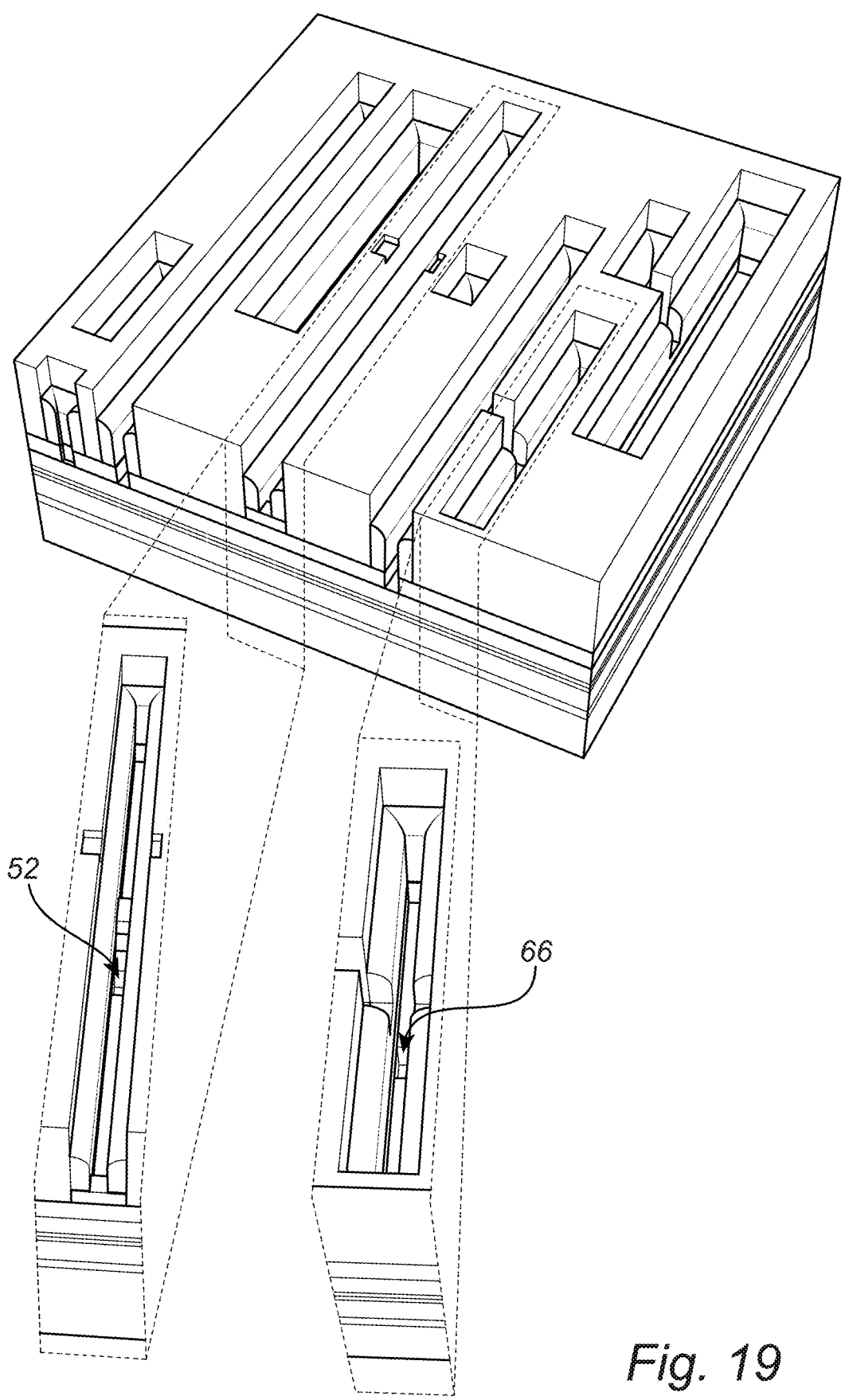

A bottom surface of the extended opening 66 may be formed by an upper surface portion of the insulating layer 10 or of an interfacial layer 11 if present. The extended opening 66 has hence not yet been transferred into lower layers to form a via opening 67 (seen in FIG. 28) but this may take place during subsequent patterning steps, such as during the below described patterning of second lower trenches 88, and/or the etching of trenches in the insulating layer 10. It is, however, also possible to already at this stage etch at least an initial via opening 67 in the insulating layer 10 (and/or any interfacial layer 11), to be deepened at a later stage, such as during the etching of trenches in the insulating layer 10. The initial via opening 67 may be etched to a same level/depth in the layer(s) 10/11 as the initial via opening 52 shown in FIG. 14. FIG. 19 shows the structure after removing the via hole etch stack 56.

Figure 20:
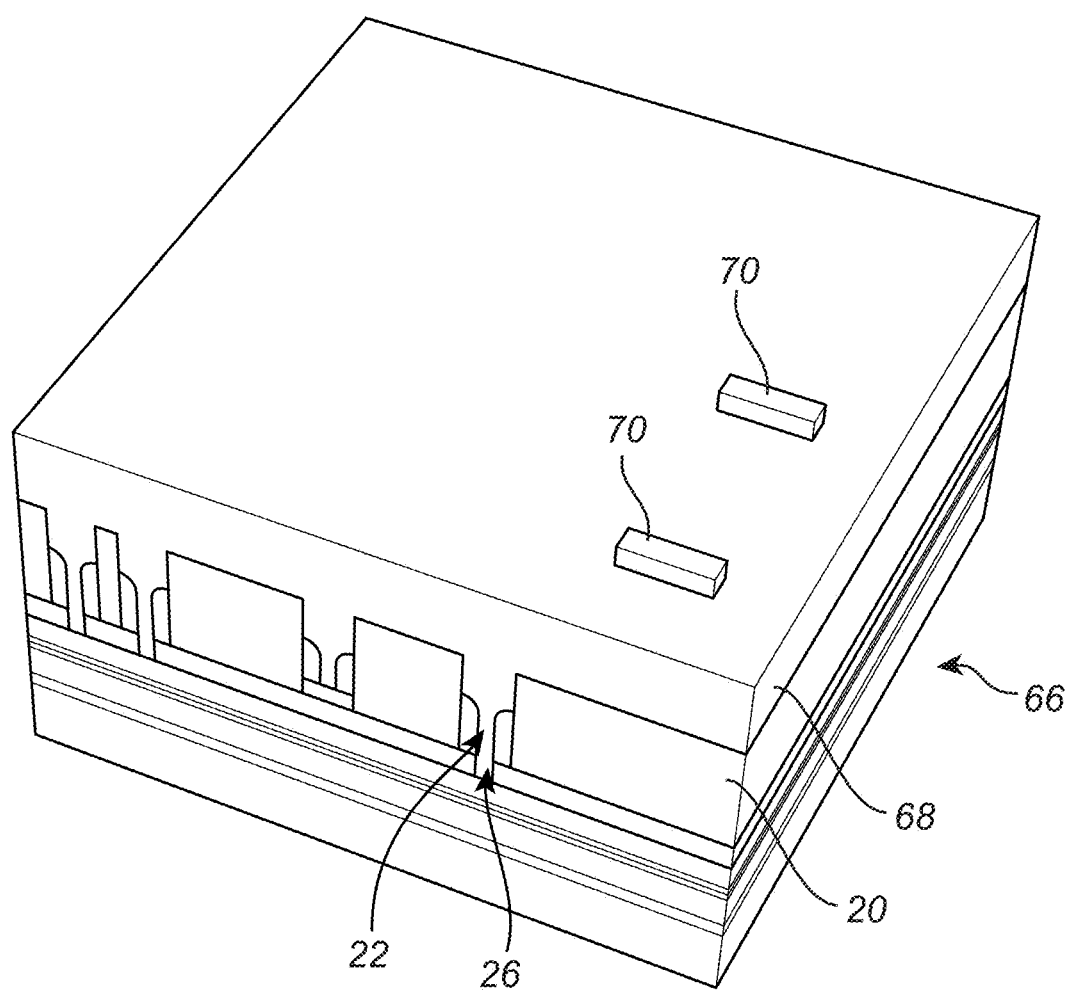
Figure 21:
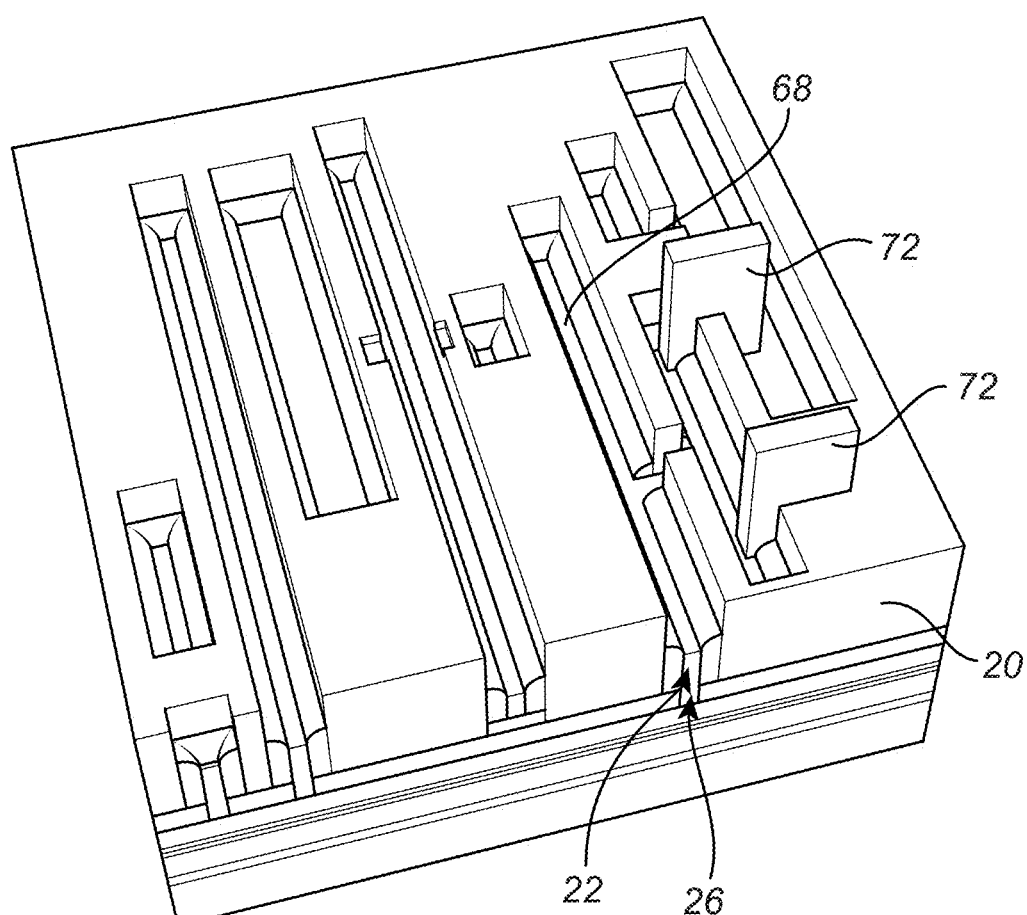
Figure 22:
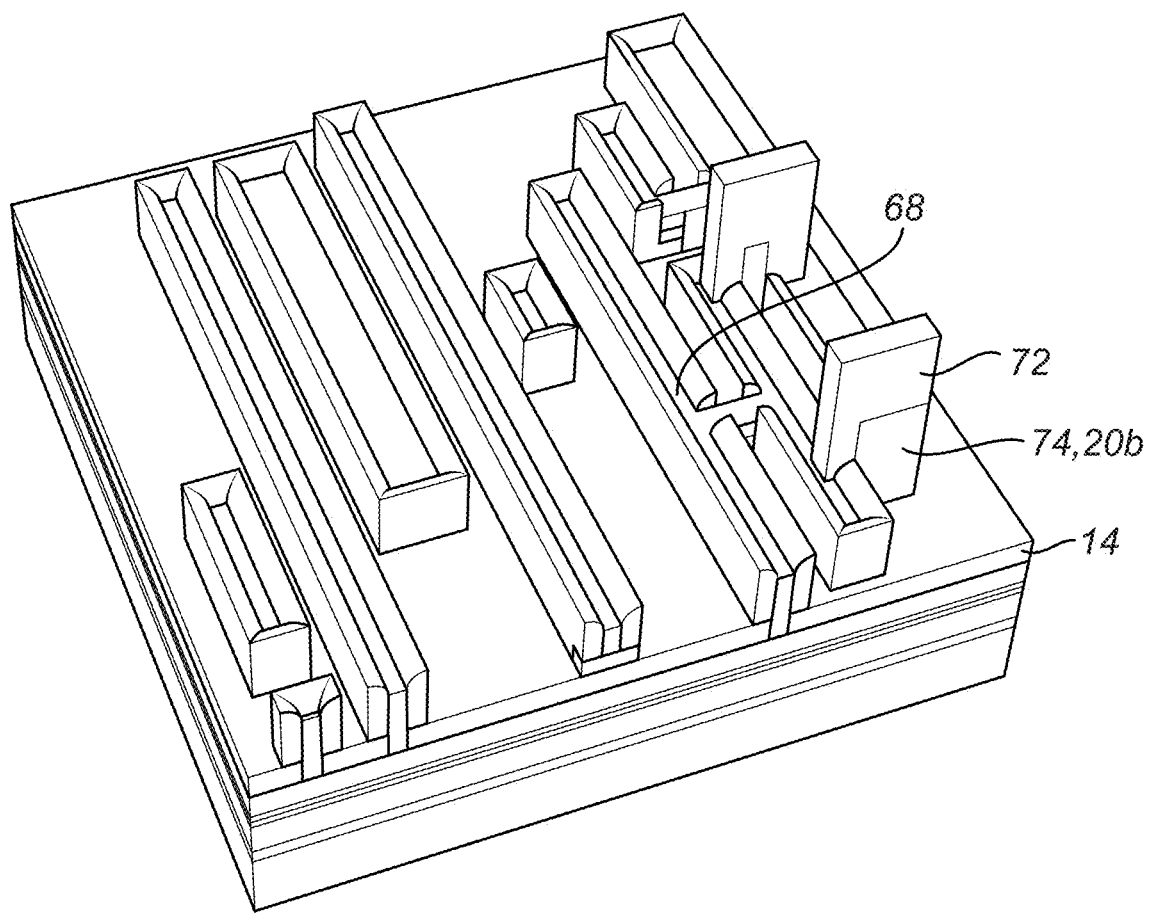

FIGS. 20-22 illustrate the patterning of the (already) patterned upper memorization layer 20 to form second upper blocks 74. These process steps may follow after the above-described via opening patterning.

The second upper blocks 74 are formed using lithography and etching. As shown in FIG. 20, an auxiliary block mask stack 66 comprising a mask material 68 and a resist layer forming resist blocks 70 is formed over the patterned upper memorization layer 20. The mask material 68 may fill the upper and first lower trenches 22, 26. The mask material 68 may form a planarizing layer covering the patterned upper memorization layer 20. The mask material 68 may be a SOC or other organic spin-on layer. Similar to the discussion of the via hole etch stacks 44, 56, additional mask materials (e.g., anti-reflective coatings) may be present in the auxiliary block mask stack 66.

The auxiliary block mask stack 66 may be patterned to form second mask blocks 72 shown in FIG. 21, by lithographically patterning the resist blocks 70 in the resist layer and then etching the mask material 68 while the resist blocks 70 masks the mask material 68. During patterning of the auxiliary block mask stack 66 the mask material 68 may be etched back until an upper surface of the patterned upper memorization layer 20 is exposed. Mask material 68 may accordingly remain in the upper and first lower trenches 22, 26.

In FIG. 22, the patterned upper memorization layer 20 has been etched while the second mask blocks 72 masks the patterned upper memorization layer 20. Second upper blocks 74 may thus be formed of respective remaining portions 20b of the patterned upper memorization layer 20. By etching the patterned upper memorization layer 20 using an etching process adapted to etch the upper memorization layer 20 at a greater rate than the mask material 68, the mask material 68 may fill the trenches 22, 26 also subsequent to forming the upper blocks 74. Correspondingly, the second mask blocks 72 may remain on the upper blocks 74. For example, the patterning of the patterned upper memorization layer 20 may comprise using an "a-Si etch," as discussed above.

After forming the second upper blocks 74, any remaining mask material 68 may be removed, for instance using a SOC etch.

FIGS. 23-26 illustrate the patterning of the (already) patterned lower memorization layer 14 to form second lower trenches 88 therein.

Figure 23:
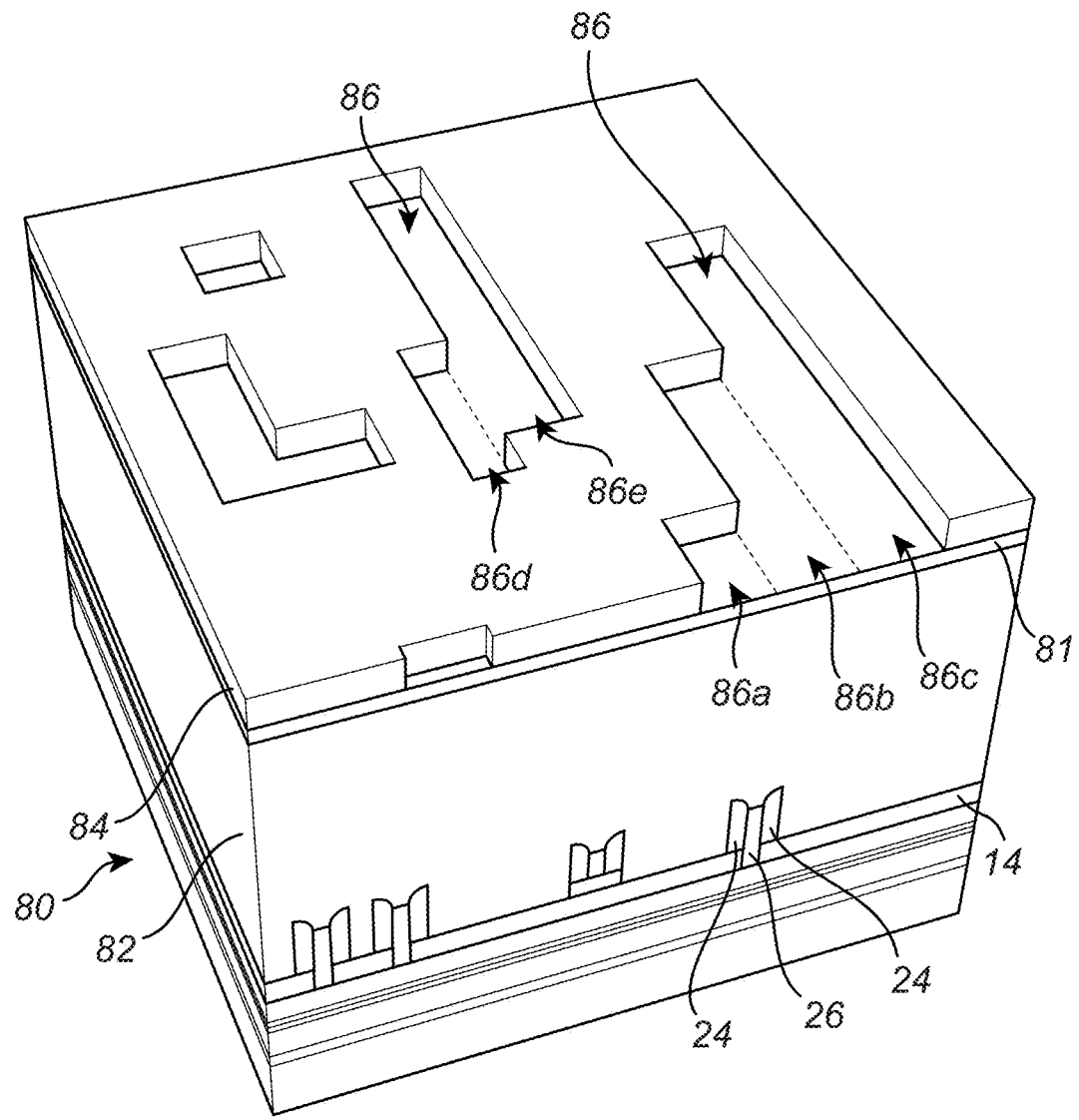

The second lower trenches 88 are formed by lithography and etching. As shown in FIG. 23, a (second) auxiliary trench mask stack 80 comprising a mask material 82 and a resist layer 84 over the mask material 82 is formed over the patterned lower memorization layer 14. The mask material 82 may fill the first lower trenches 26. The mask material 82 may further cover the second upper blocks 74. The mask material 82 may form a planarizing layer. The mask material 82 may be a SOC or other organic spin-on material. Similar to the discussion of the auxiliary trench mask stack 22, additional mask materials (e.g., an anti-reflective coating 81) may be present in the auxiliary block mask stack 80.

Figure 24:
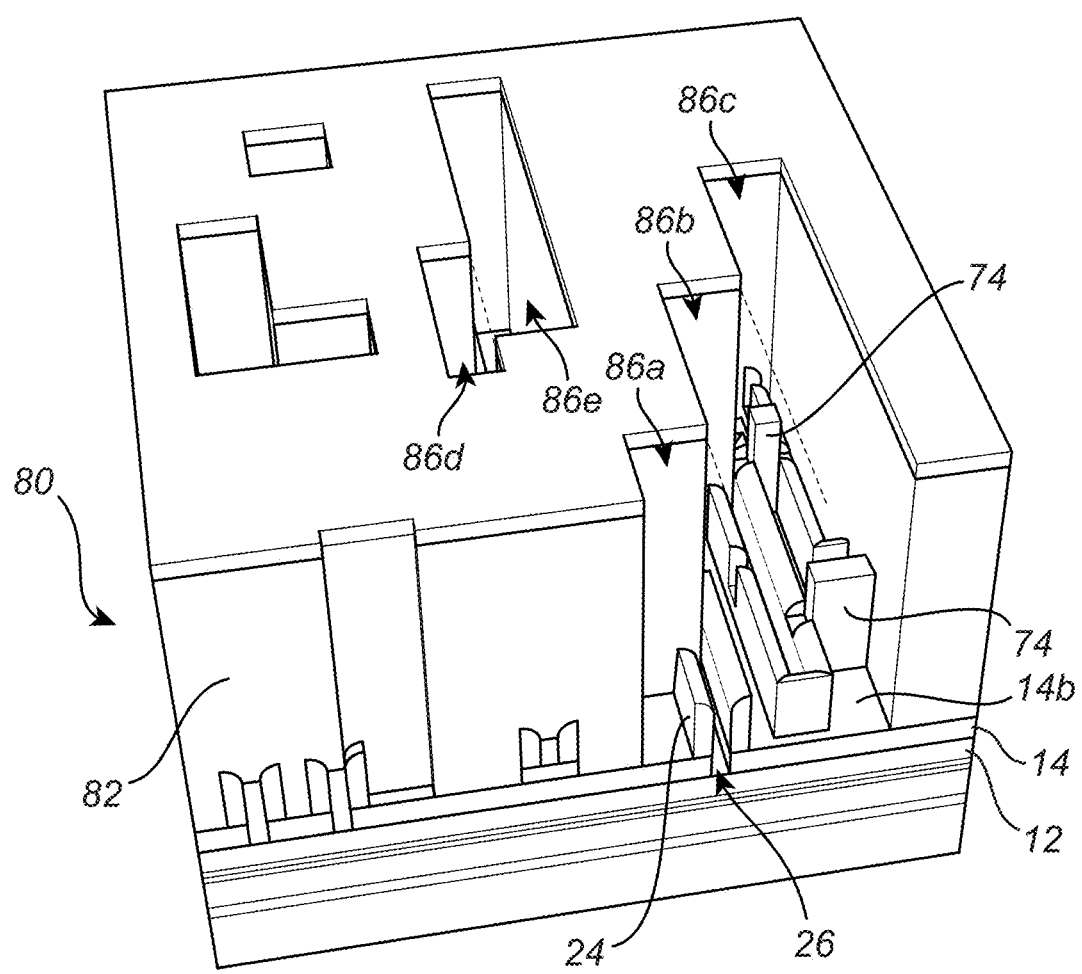

The auxiliary trench mask stack 80 may be patterned to form auxiliary trenches 86 by lithographically patterning auxiliary trenches 86 in the resist layer 84, as shown in FIG. 23, and then transferring the auxiliary trenches 86 into the mask material 82 by etching through the auxiliary trenches 86 in the resist layer 84, as shown in FIG. 24. During patterning of the auxiliary trench mask stack 80 the mask material 82 may be etched back at least until an upper surface 14b of the patterned lower memorization layer 14 is exposed, or further until an upper surface of the target memorization layer 12 is exposed. The auxiliary trenches 86 may expose and extend across second upper blocks 74.

Figure 25:
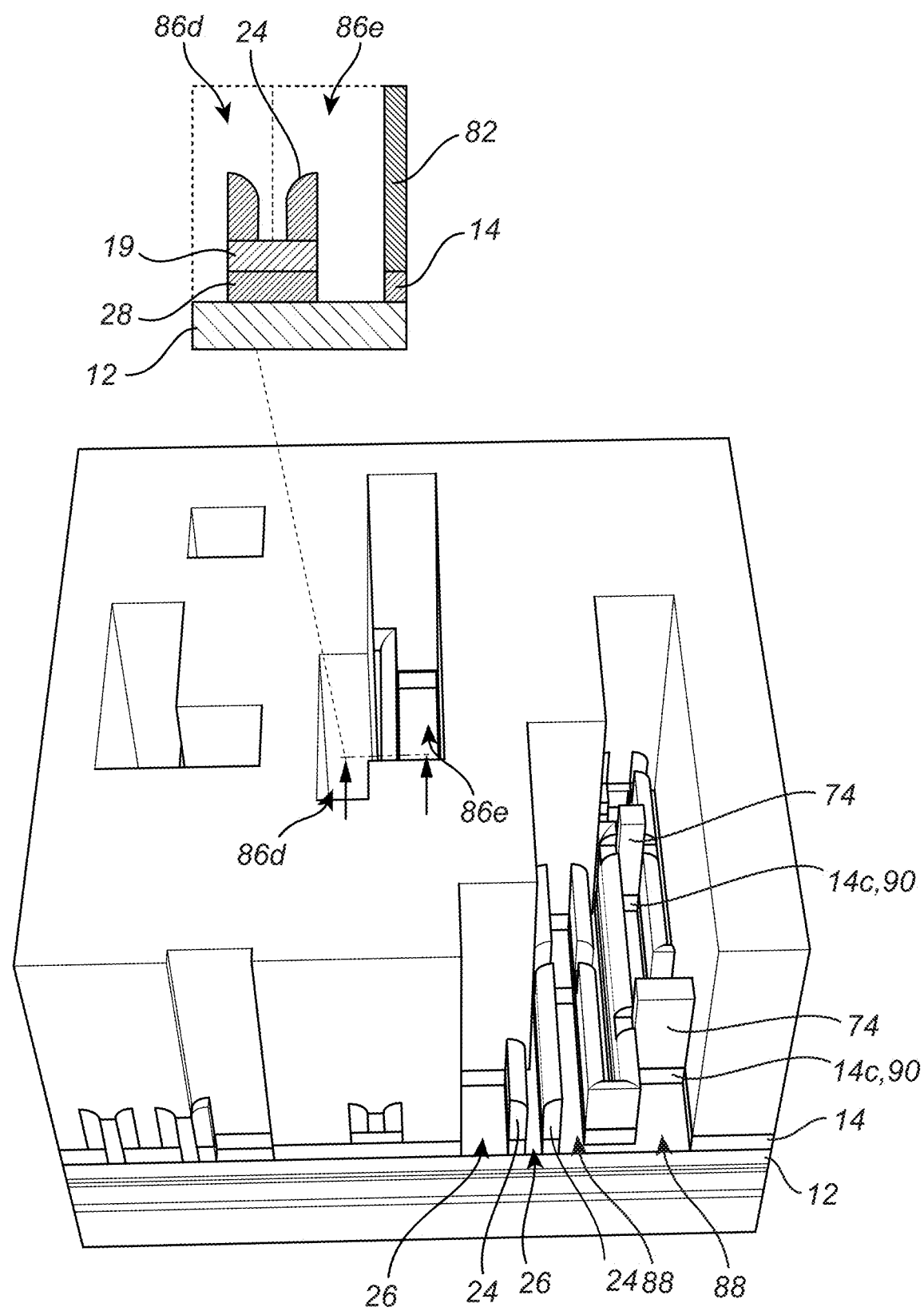

In FIG. 25, the patterned lower memorization layer 14 has been etched while the patterned auxiliary trench mask stack 80, the second upper blocks 74 and the spacer lines 24 mask the patterned lower memorization layer 14, thereby forming the second lower trenches 88. In other words, the patterning may comprise etching back upper surface portions 14b of the patterned lower memorization layer 14 exposed in the auxiliary trenches 86 (i.e., which are not masked by the second upper blocks 74 and the spacer lines 77).

At each position in the patterned lower memorization layer 14 underneath a second upper block 74, a respective second lower block 90 has been formed by a respective second lower memorization layer portion 14c masked during the etching. Hence, at least a subset of the second lower trenches 88 may be interrupted by a respective second lower block 90.

The patterning of the patterned lower memorization layer 14 may comprise a selective etching of the patterned lower memorization layer 14 (i.e., using an etching process adapted to etch the patterned lower memorization layer 14 at a greater rate than the second upper blocks 74, the spacer lines 24 and the first upper blocks 19).

Reference signs 86a-c and 86d-e in FIGS. 23-25 indicate relaxed CD auxiliary trenches extending above/overlapping not only remaining portions of the lower memorization layer 14 in which the second lower trenches 88 are to be formed, but also one or more first lower trenches 22. The auxiliary trenches 86 may accordingly also extend above a first upper block 19 and a first lower block 28, as shown in the enlarged view inset of FIG. 25 along the auxiliary trenches 86d, 86e. By the presence of the first upper blocks 19, each first lower block 28 exposed in the auxiliary trenches 86 may accordingly be masked during the selective etching of the patterned lower memorization layer 14 and hence preserved after the formation of the second lower trenches 88 is complete. Moreover, the spacer lines 24 allow a minimum spacing between the first and second lower trenches 26, 88 to be ensured.

Figure 26:
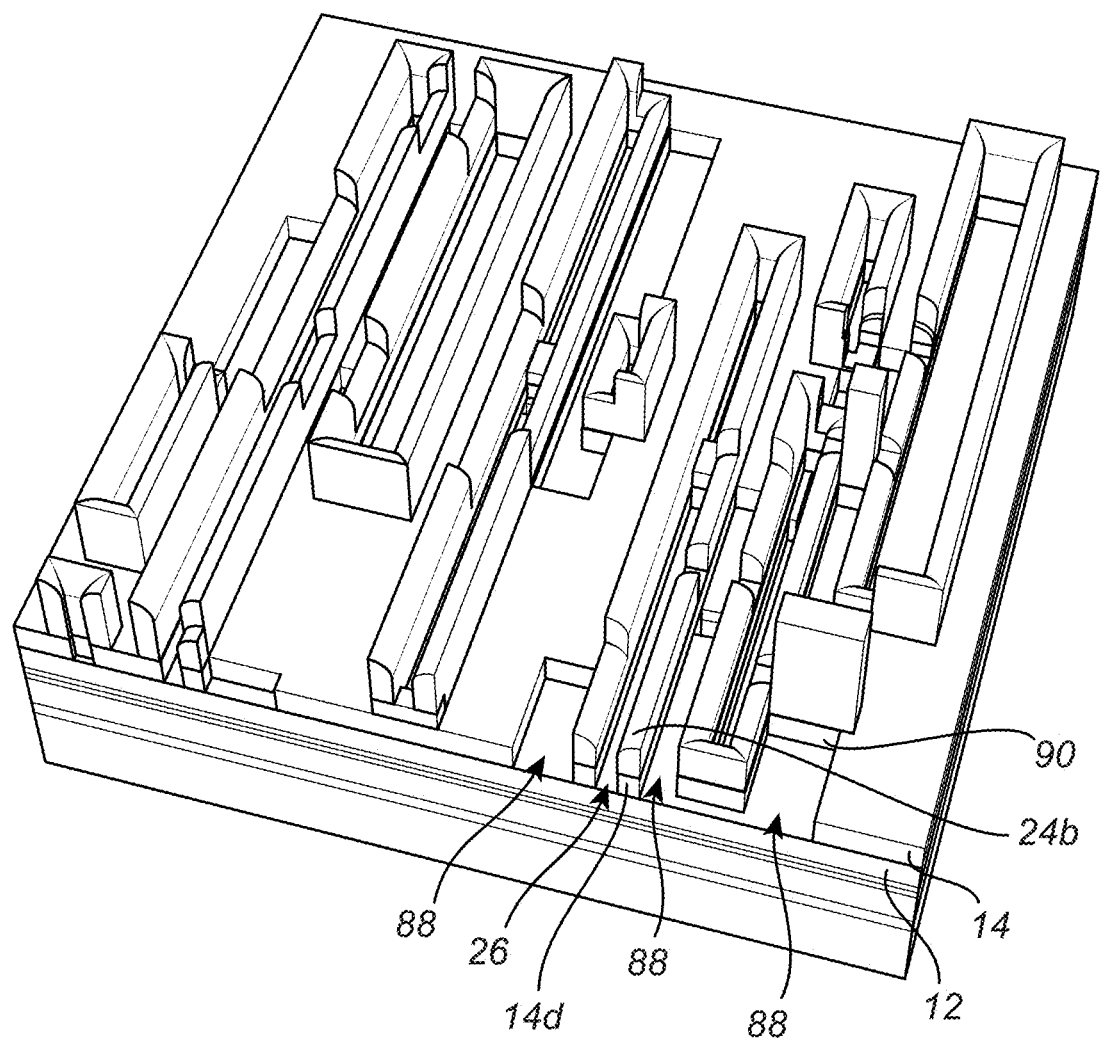

In FIG. 26, the patterned auxiliary trench mask stack 80 has been removed from the structure (e.g., using an SOC etch), thus revealing the (twice) patterned lower memorization layer 14 with the first and second lower trenches 26, 88 formed therein. The second lower trenches 88 may be arranged alternatingly with the first lower trenches 26. As further shown, one or more second lower trenches 88 may be spaced from an adjacent first trench 26 by only a lower line formed by a (wall-shaped) portion 14d of the patterned lower memorization layer 14 preserved under a spacer layer portion 24b. The line width of this lower line 14d matches or at least corresponds to a line width of the spacer line portion 24b.

Figure 27:
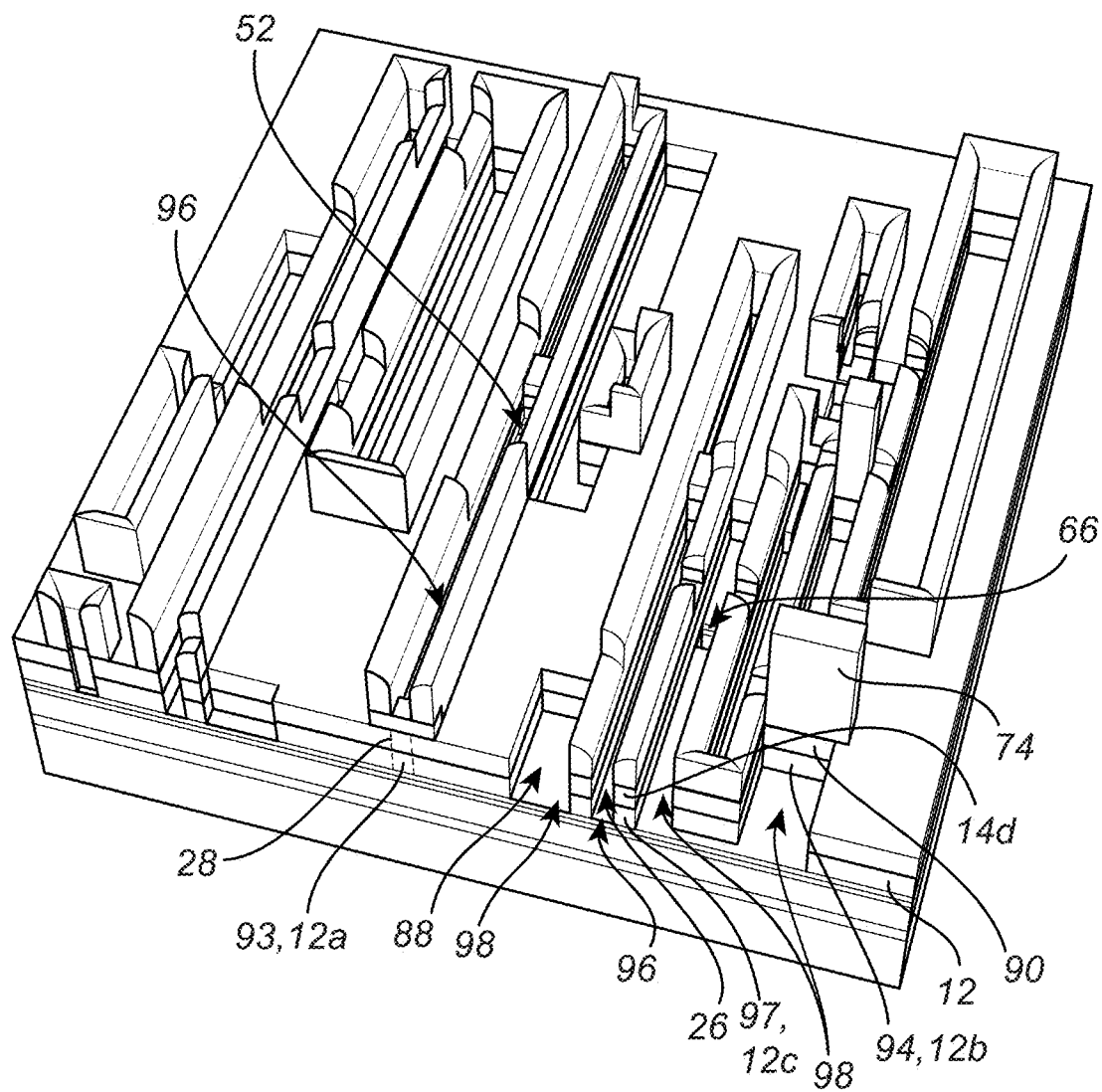

In FIG. 27, the target memorization layer 12 has been patterned to form a first set of "target" trenches 96 underneath the first lower trenches 26 and a second set of "target" trenches 98 underneath the second lower trenches 88. The patterning of the target memorization layer 12 may comprise etching the target memorization layer 12 while the (twice) patterned lower memorization layer 14 masks the target memorization layer 12. In other words, the first set of trenches 96 may be formed by etching back the target memorization layer 12 through the first lower trenches 26 and the second set of trenches 98 may be formed by etching back the target memorization layer 12 through the second lower trenches 98. A bottom surface of the trenches 96, 98 may be formed by an upper surface of the interfacial layer(s) 11 or the insulating layer 10.

Underneath each first lower block 28, a first target block 93 has been formed by a respective first target memorization layer portion 12a masked by the first lower block 28 during the etching of the target memorization layer 12. Hence, a respective first target memorization layer portion 12a may be preserved underneath each first lower block 28. Accordingly, at least a subset of the first target trenches 96 are interrupted by a respective first target block 93.

Underneath each second lower block 90, a second target block 94 has been formed by a respective second target memorization layer portion 12b masked by the second lower block 90 during the etching of the target memorization layer 12. Hence, a respective second target memorization layer portion 12b may be preserved underneath each second lower block 90. Accordingly, at least a subset of the second target trenches 98 are interrupted by a respective second target block 94.

A second target trench 98 may, as shown, be spaced from an adjacent first target trench 96 by (only) a lower line 97 formed of a third target memorization layer portion 12c masked by a respective lower line 14d during the etching.

In FIG. 27, the target memorization layer 12 is also masked by the upper blocks 74 and the spacer lines 32. This may provide an increased mask budget during the patterning of the target memorization layer 12. However, it is possible that one or more of these features have been removed prior to the patterning of the target memorization layer 12.

Figure 28:
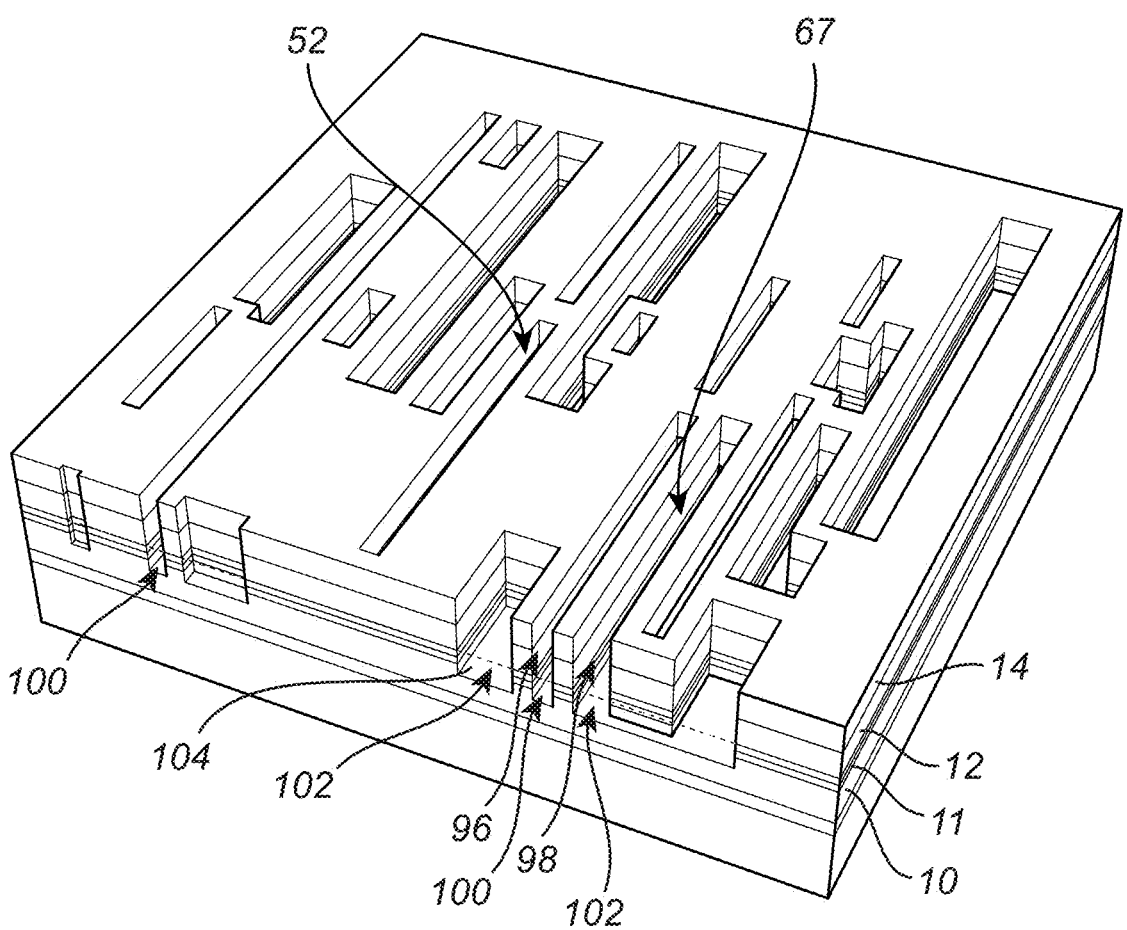

Subsequent to patterning the target memorization layer 12, the first and second upper blocks 19, 74 and the spacer lines 24 may be removed from the patterned target memorization layer 12. A resulting structure is shown in FIG. 28.

Trenches have further been etched in the insulating layer 10 and the interfacial layer(s) 11 while (at least) the patterned target memorization layer 12 masks the layer(s) 10/11, thereby forming first insulating layer trenches 100 underneath the first set of target trenches 96 and second insulating layer trenches 102 underneath the second set of target trenches 98. Hence, the trench pattern defined in the target memorization layer 12 has been transferred into the insulating layer 10, including any interrupted trenches. The etching of the trenches in the insulating layer may simultaneously result in final deepened via openings 52, 67, similar to a dual damascene process.

Although not shown, the patterned lower memorization layer 14 may also be removed prior to forming the trenches 100, 102. It is also possible to remove one or more of the first and second upper blocks 19, 74 and the spacer lines 24 only after forming the trenches 100, 102.

As further schematically indicated, the trenches and via openings in the insulating layer 10 may be filled with a conductive material 104. As may be appreciated, the conductive material 104 may, however, be deposited first after removing the target memorization layer 12 (and lower memorization layer 14). The conductive material 104 may be one or more metals conventionally used to form metal lines and vias in BEOL processing, such as W, Cu, Al, or Ru to provide a few non-limiting examples.

While certain examples are described above, it will be readily appreciated by a person skilled in the art that examples, other than the ones disclosed above, are equally possible within the scope of the claims.

For example, the method may proceed with depositing a further insulating layer over the insulating layer 10 and the metal lines and vias therein. The above method steps may thereafter be repeated to form a further higher interconnection level. This may be repeated until a desired number of interconnection levels have been formed.

According to a further example, the step of removing the auxiliary block mask layer 16 (and optional liner layer 16') prior to forming the upper memorization layer 20 may be omitted. After the stage shown in FIG. 5, the method may proceed with forming the upper memorization layer 20 over the patterned auxiliary block mask layer 16 (and optional liner layer 16') and the first upper blocks 19. The patterned auxiliary mask layer 16 may hence be present as an intermediate layer between the upper memorization layer 20 and the lower memorization layer 14 during subsequent steps. If the auxiliary block mask layer 16 is formed of a material different from the upper memorization layer 20 the process steps described in connection with FIG. 7 and onwards may accordingly be understood by considering references to the upper memorization layer 20 as references to a dual-layer stack of the patterned auxiliary block mask layer 16 and the upper memorization layer 20. For example, the trenches 22 may be etched to extend through the dual layer stack, and the second upper blocks 74 may be formed as dual-layered blocks. As may be appreciated, depending on the material of the auxiliary block mask layer 16, the patterning of, for example, the upper trenches 22 and the second upper blocks 74 may comprise switching from a first etching chemistry (for etching the upper memorization layer 20) to a second etching chemistry (for etching the auxiliary block mask layer 16). However, if the auxiliary block mask layer 16 is formed of a same material as the upper memorization layer 20 (e.g., a-Si), the process steps may proceed in the manner shown and described above from FIG. 7 and onwards.

Moreover, in the above process flow, the first set of trenches 96 and the second set of trenches 98 are patterned simultaneously in the target memorization layer 12. However, a sequential approach is also possible wherein the first set of trenches 96 are patterned in the target memorization layer 12 prior to patterning the second set of trenches 98 in the target memorization layer 12. According to a sequential approach, the first set of trenches 96 may, for example, be formed subsequent to forming the first lower trenches 26 and prior to patterning the patterned upper memorization layer 20 to form the second upper blocks 74. The second set of trenches 98 may be formed subsequent to forming the second lower trenches 88 in the patterned lower memorization layer 14. If vias are to be formed in a first and/or second via formation process as described above, the first set of trenches 96 may, for example, be formed in the target memorization layer 12 prior to the via formation process(es).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A patterning method comprising:
   forming a lower memorization layer over an underlying layer and an auxiliary block mask layer over the lower memorization layer;
   forming block openings in the auxiliary block mask layer;
   forming first upper blocks in the block openings;
   forming an upper memorization layer over the lower memorization layer and the first upper blocks;
   patterning the upper memorization layer using lithography and etching to form upper trenches in the upper memorization layer, wherein at least a subset of the upper trenches are interrupted by a respective first upper block;
   forming sidewall spacer lines along sidewalls of the upper trenches;
   patterning the lower memorization layer to form first lower trenches in the lower memorization layer, the patterning comprising etching while the patterned upper memorization layer, the sidewall spacer lines, and the first upper blocks mask the lower memorization layer, wherein at least a subset of the first lower trenches are interrupted by a respective first lower block formed of a respective first lower memorization layer portion masked by a respective first upper block;
   patterning the patterned upper memorization layer using lithography and etching to form second upper blocks of remaining upper memorization layer portions; and
   patterning the patterned lower memorization layer to form second lower trenches in the patterned lower memorization layer, the patterning comprising:
   forming an auxiliary trench mask stack over the lower memorization layer and patterning auxiliary trenches therein by lithography and etching to provide a patterned auxiliary trench mask; and
   etching the patterned lower memorization layer while the patterned auxiliary trench mask stack, the spacer lines and the second upper blocks mask the patterned lower memorization layer, and the first upper blocks mask the first lower blocks, wherein at least a subset of the second lower trenches are interrupted by a respective second lower block formed of a respective second lower memorization layer portion masked by a respective second upper block; and
   patterning in the underlying layer a first set of trenches underneath the first lower trenches and a second set of trenches underneath the second lower trenches.

2. The method according to claim 1, wherein forming the first upper blocks comprises:
   depositing a block material over the auxiliary block mask layer and in the block openings; and
   removing block material deposited outside the block openings such that block material remains in the block openings to form the first blocks.

3. The method according to claim 1, wherein forming the first upper blocks comprises:
   forming a conformal block layer of a block material over the auxiliary block mask layer that conforms to sidewalls of the block openings, wherein the block material deposited on the sidewalls merges in the block openings; and
   etching back the conformal block layer such that block material deposited outside the block openings is removed and block material remains in the block openings to form the first upper blocks.

4. The method according to claim 1, wherein forming the block openings comprises:
   patterning initial block openings in the auxiliary block mask layer using lithography and etching; and
   subsequently forming a final block openings by forming a liner layer conforming to sidewalls of the initial block openings.

5. The method according to claim 1, further comprising:
   subsequent to forming the first lower trenches, forming an auxiliary block mask stack comprising mask material that fills the upper trenches and the first lower trenches, and a resist layer;
   wherein the patterning of the patterned upper memorization layer comprises:
   patterning the auxiliary block mask stack to form auxiliary blocks using lithography and etching; and
   subsequently patterning the patterned upper memorization layer to form the second upper blocks, the patterning comprising etching while the auxiliary blocks mask the patterned upper memorization layer.

6. The method according to claim 1, wherein the auxiliary trench mask stack comprises mask material that forms a planarizing layer that covers the second upper blocks, the spacer lines, and the patterned lower memorization layer; and a resist layer.

7. The method according to claim 6, wherein at least one auxiliary trench extends above a first lower trench and a first upper block above a first lower block located in the first lower trench.

8. The method according to claim 7, wherein the mask material comprises an organic spin-on layer.

9. The method according to claim 8, further comprising:
   prior to the patterning of the patterned upper memorization layer:

forming a via hole etch stack comprising a mask material that fills the lower and the upper trenches, and a resist layer;

forming an opening in the via hole etch stack, the opening exposing a bottom surface of a selected first lower trench, the opening exposing spacer layer portions on opposite sides of the selected first lower trench;

etching back the exposed bottom surface to form an opening in a target memorization layer; and etching an insulating layer through the opening in the target memorization layer.

10. The method according to claim 6, wherein the mask material comprises an organic spin-on layer.

11. The method according to claim 5, wherein at least one auxiliary trench extends above a first lower trench and a first upper block above a first lower block located in the first lower trench.

12. The method according to claim 1, wherein trenches of at least a subset of the second lower trenches are arranged alternatingly with trenches of at least a subset of the first set of lower trenches.

13. The method according to claim 12, wherein each trench of the at least a subset of the second lower trenches is spaced from an adjacent trench of the at least a subset of the first lower trenches by a respective lower line formed of a respective third lower memorization layer portion preserved under a spacer layer portion.

14. A method for forming an interconnection structure, comprising:

forming over an insulating layer a target memorization layer;

forming a first and a second set of trenches in the target memorization layer in accordance with a method according to claim 13, wherein the underlying layer is the target memorization layer;

subsequent to forming the first and second trenches in the target memorization layer, etching trenches in the insulating layer while the patterning layer masks the insulating layer; and depositing a conductive material in the trenches in the insulating layer.

15. The method according to claim 14, further comprising:

prior to the patterning of the patterned upper memorization layer:

forming a via hole etch stack comprising a mask material that fills the upper and lower trenches, and a resist layer;

forming an opening in the via hole etch stack, the opening exposing an upper surface of a remaining portion of the upper memorization layer, etching back the exposed upper surface of the upper memorization layer to form an opening in the upper memorization layer; and sequentially etching back the lower and target memorization layers through the opening in the upper memorization layer to form an extended opening therethrough; and etching the insulating layer through the extended opening.

16. The method according to claim 15, wherein the etch back of the exposed upper surface of the upper memorization layer etches the upper memorization layer at a greater rate than the mask material or at a greater rate than the spacer lines.

17. The method according to claim 16, wherein the exposed upper surface of the upper memorization layer is located between a pair of upper trenches, and wherein a width of the opening in the via hole etch stack exceeds a spacing between the pair of upper trenches.

18. The method according to claim 15, wherein the exposed upper surface of the upper memorization layer is located between a pair of upper trenches, and wherein a width of the opening in the via hole etch stack exceeds a spacing between the pair of upper trenches.

19. The method according to claim 14, further comprising:

prior to the patterning of the patterned upper memorization layer:

forming a via hole etch stack comprising a mask material filling the lower and the upper trenches, and further comprising a resist layer;

forming an opening in the via hole etch stack, the opening exposing a bottom surface of a selected first lower trench, the opening exposing spacer layer portions on opposite sides of the selected first lower trench;

etching back the exposed bottom surface to form an opening in the target memorization layer; and etching the insulating layer through the opening in the target memorization layer.

20. A method for forming an interconnection structure, comprising:

forming over an insulating layer a target memorization layer;

forming a first and a second set of trenches in the target memorization layer in accordance with a method according to claim 1, wherein the underlying layer is the target memorization layer;

subsequent to forming the first and second trenches in the target memorization layer, etching trenches in the insulating layer while the patterning layer masks the insulating layer; and depositing a conductive material in the trenches in the insulating layer.

* * * * *